US011302553B1

(12) United States Patent
Huang et al.

(10) Patent No.: US 11,302,553 B1
(45) Date of Patent: *Apr. 12, 2022

(54) TRANSPORT CARRIER DOCKING DEVICE

(71) Applicant: Taiwan Semiconductor Manufacturing Company Limited, Hsinchu (TW)

(72) Inventors: Chih-Hung Huang, Hsinchu (TW); Cheng-Lung Wu, Miaoli (TW); Yang-Ann Chu, Hsinchu (TW); Hsuan Lee, Tainan (TW); Jiun-Rong Pai, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/248,072

(22) Filed: Jan. 7, 2021

(51) Int. Cl.
 *H01L 21/677* (2006.01)
(52) U.S. Cl.
 CPC .. *H01L 21/67778* (2013.01); *H01L 21/67754* (2013.01); *H01L 21/67772* (2013.01); *H01L 21/67775* (2013.01)
(58) Field of Classification Search
 None
 See application file for complete search history.

(56) References Cited

U.S. PATENT DOCUMENTS

| | | | | | |
|---|---|---|---|---|---|
| 5,772,386 | A * | 6/1998 | Mages | ............. | H01L 21/67772 414/411 |
| 6,120,229 | A * | 9/2000 | Hofmeister | ....... | H01L 21/67772 414/217 |
| 6,238,283 | B1 * | 5/2001 | Matsuyama | ........ | H01L 21/6732 454/187 |
| 6,364,595 | B1 * | 4/2002 | Bonora | ............... | G03F 7/70741 294/106 |
| 7,597,523 | B2 * | 10/2009 | Bonora | ............. | H01L 21/67775 414/411 |
| 8,936,050 | B2 * | 1/2015 | Sugawara | ......... | H01L 21/67772 141/98 |
| 9,082,807 | B2 * | 7/2015 | Sugawara | ......... | H01L 21/68735 |
| 9,406,537 | B2 * | 8/2016 | Oyama | ............. | H01L 21/67373 |
| 2008/0008564 | A1 * | 1/2008 | Bonora | ............. | H01L 21/67775 414/217 |
| 2008/0031708 | A1 * | 2/2008 | Bonora | ............. | H01L 21/67775 414/217 |

(Continued)

*Primary Examiner* — Gerald McClain
(74) *Attorney, Agent, or Firm* — Harrity & Harrity, LLP

(57) ABSTRACT

A transport carrier docking device may be capable of forming an air-tight seal around a transport carrier while a front portion of the transport carrier is inserted into a chamber of the transport carrier docking device. Semiconductor wafers in the transport carrier may be accessed by a transport tool while the air-tight seal exists around the transport carrier, which prevents and/or reduces the likelihood that contaminants in a semiconductor fabrication facility will reach the semiconductor wafers. The air-tight seal around the transport carrier may reduce defects of the semiconductor wafers that might otherwise be caused by the contaminants, may increase manufacturing yield and quality in the semiconductor fabrication facility, and/or may permit the continued reduction in device and/or feature sizes of integrated circuits and/or semiconductor devices that are to be formed on semiconductor wafers.

20 Claims, 22 Drawing Sheets

(56) References Cited

U.S. PATENT DOCUMENTS

| | | | | |
|---|---|---|---|---|
| 2008/0031709 A1* | 2/2008 | Bonora | ............. | H01L 21/67772 |
| | | | | 414/217 |
| 2010/0028111 A1* | 2/2010 | Krolak | .............. | H01L 21/67772 |
| | | | | 414/411 |
| 2012/0241032 A1* | 9/2012 | Sugawara | ......... | H01L 21/67772 |
| | | | | 137/544 |
| 2014/0064885 A1* | 3/2014 | Oyama | ............. | H01L 21/67389 |
| | | | | 414/160 |
| 2015/0311100 A1* | 10/2015 | Miyajima | ......... | H01L 21/67126 |
| | | | | 414/217 |
| 2020/0090966 A1* | 3/2020 | Newman | ........... | H01L 21/67754 |

* cited by examiner

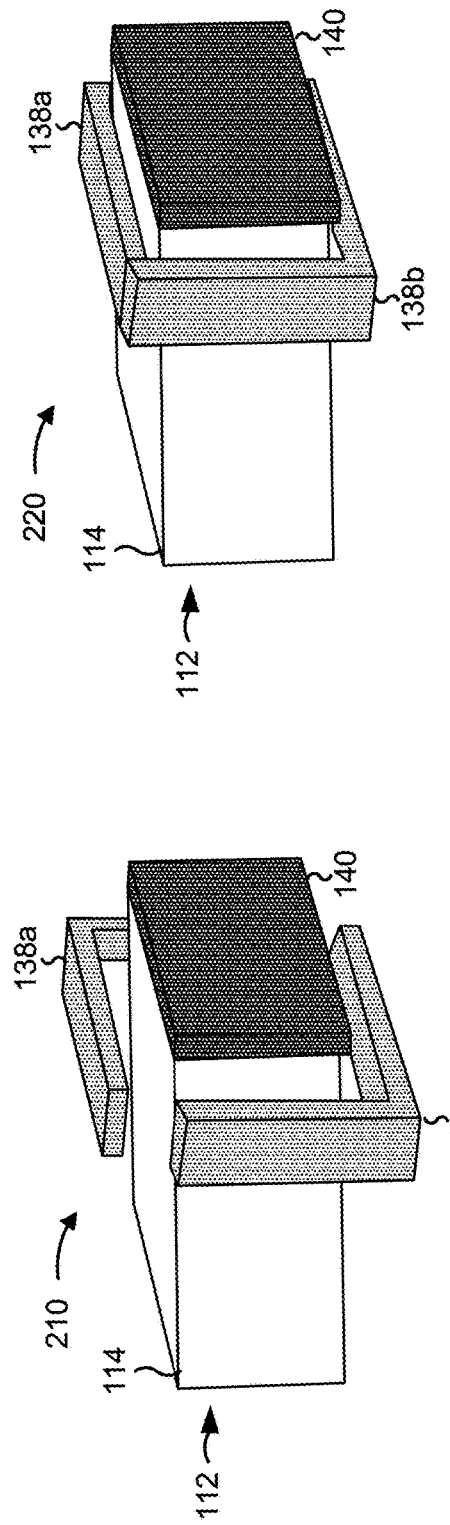
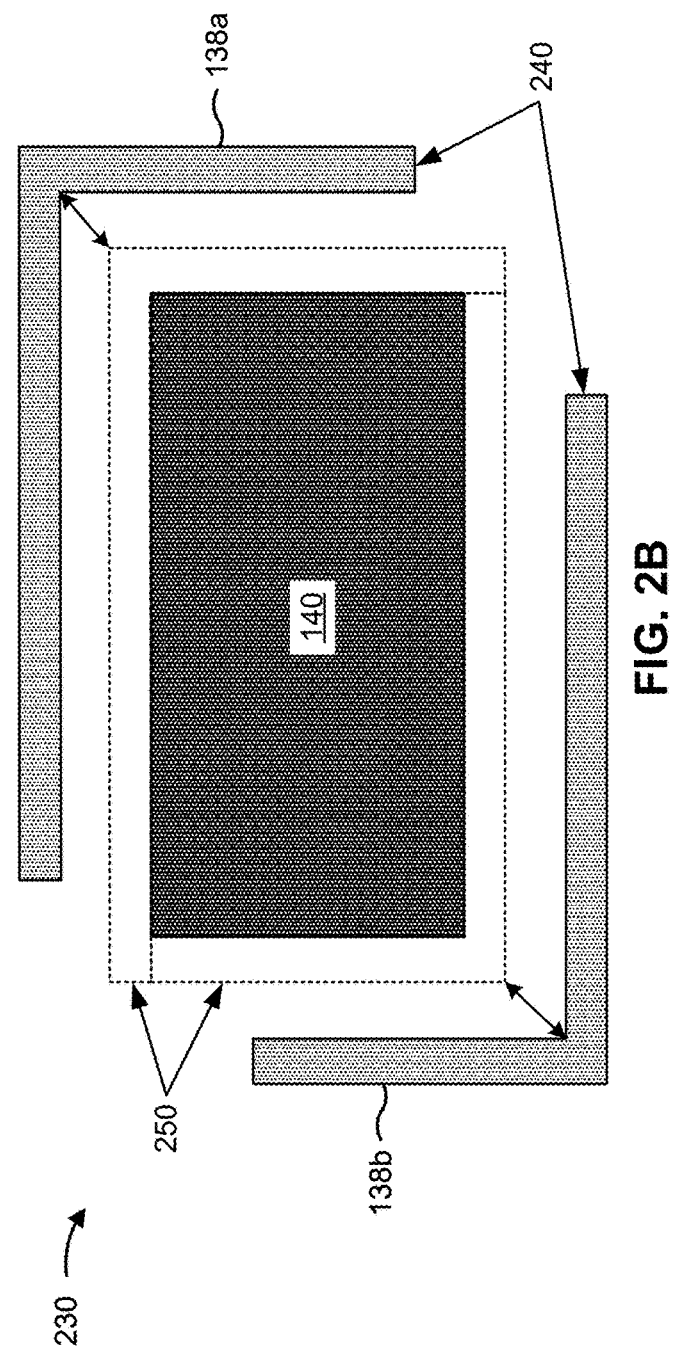
FIG. 2A
FIG. 2B

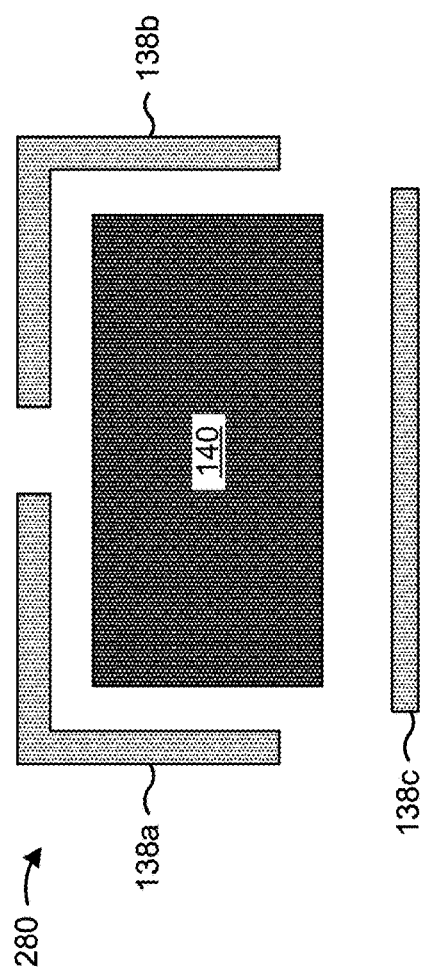
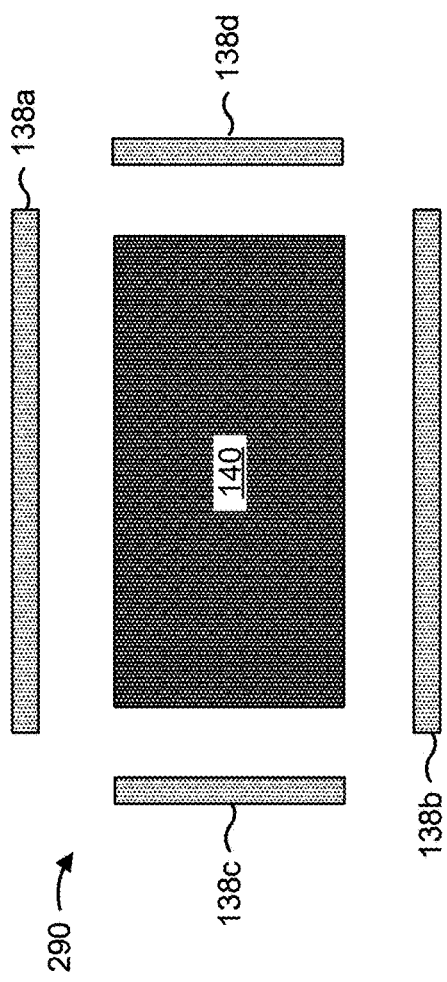

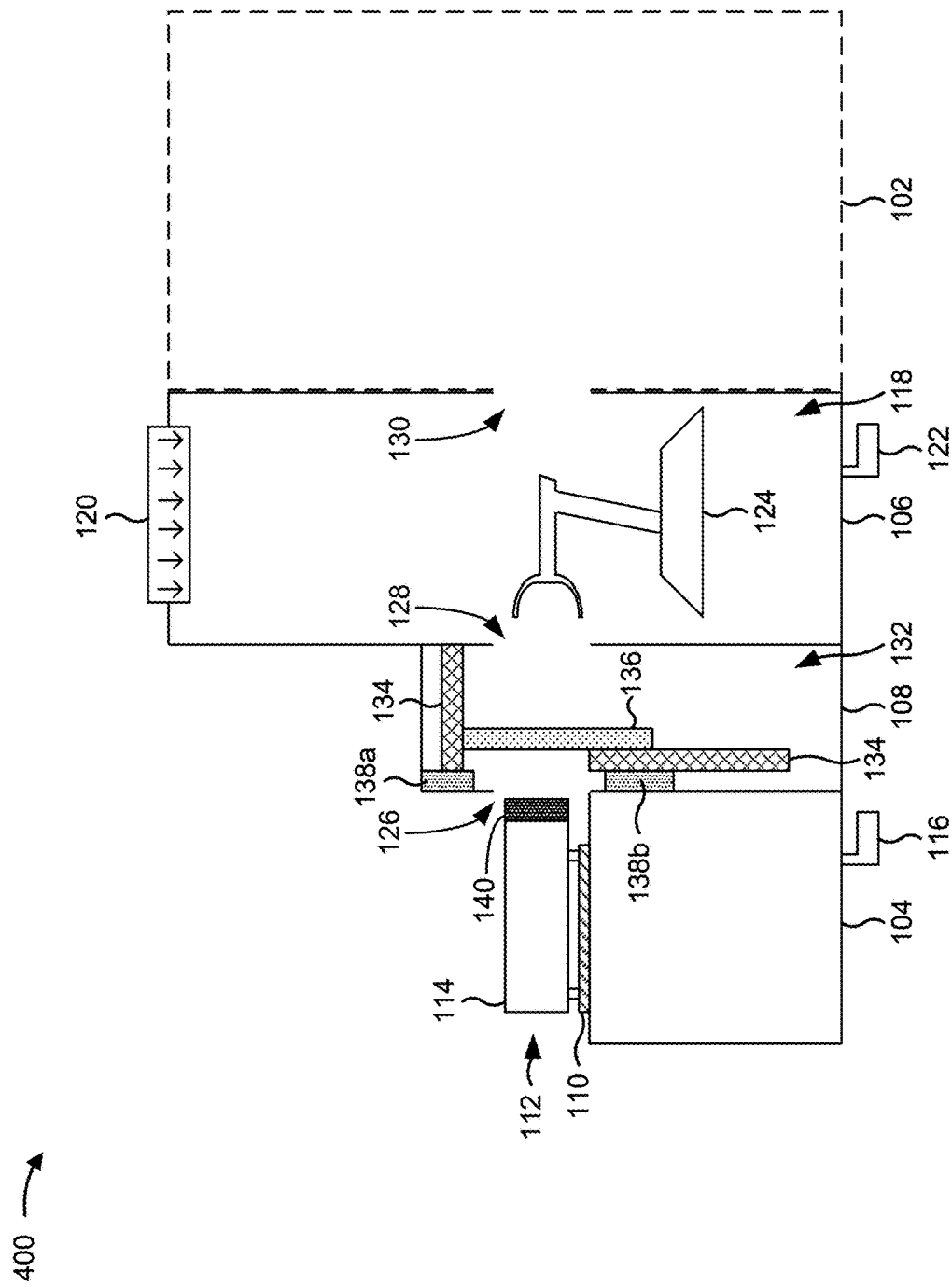

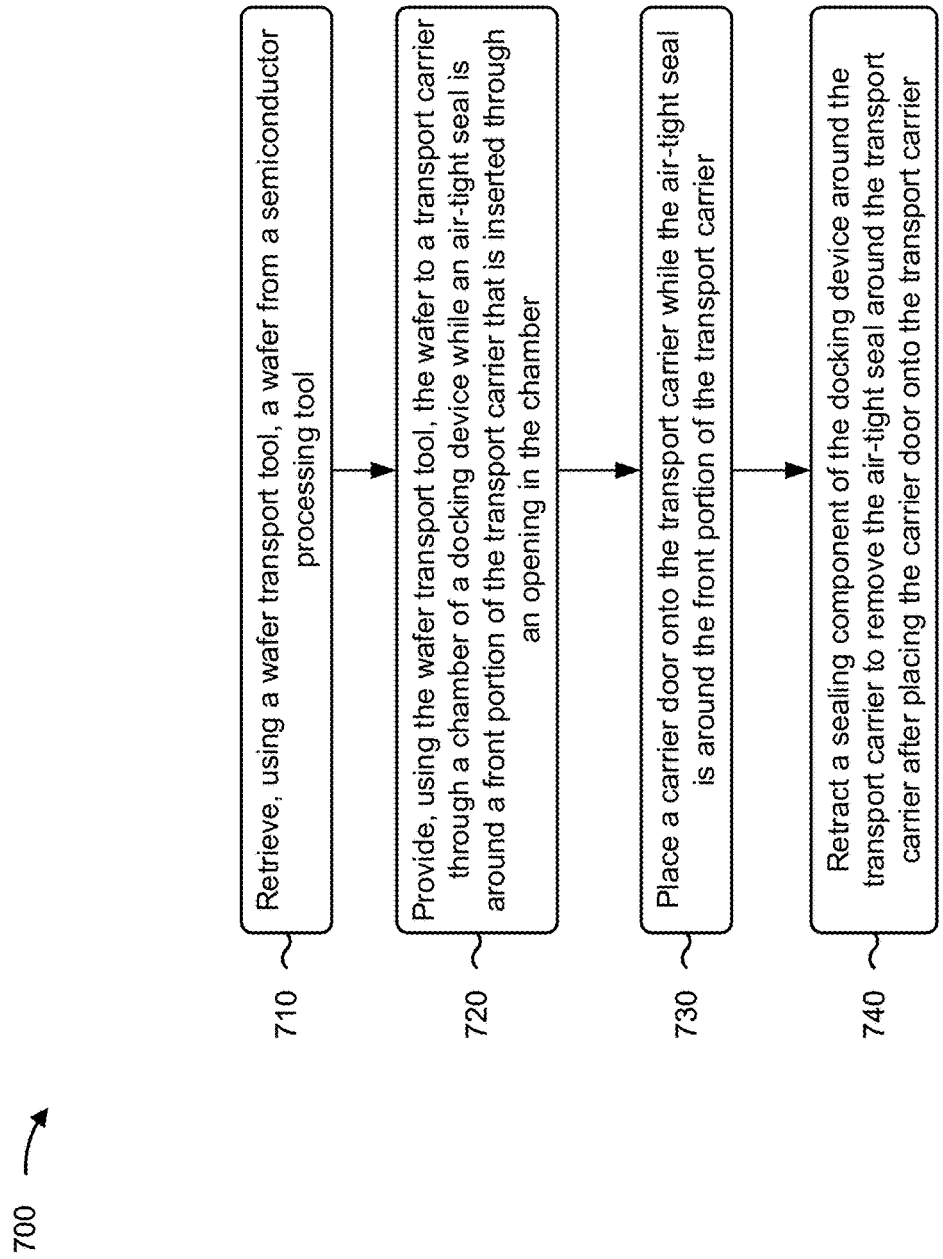

TRANSPORT CARRIER DOCKING DEVICE

BACKGROUND

A semiconductor wafer may be processed in various semiconductor processing tools in a semiconductor fabrication facility to produce various integrated circuits and/or semiconductor devices. A semiconductor wafer may be transported throughout the semiconductor fabrication facility and/or between the semiconductor processing tools in the semiconductor fabrication facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F are diagrams of example implementations of a sealing component for forming an air-tight seal around a transport carrier described herein.

FIGS. 6 and 7 are flowcharts of example processes relating to accessing a transport carrier.

DETAILED DESCRIPTION

Figure 1:
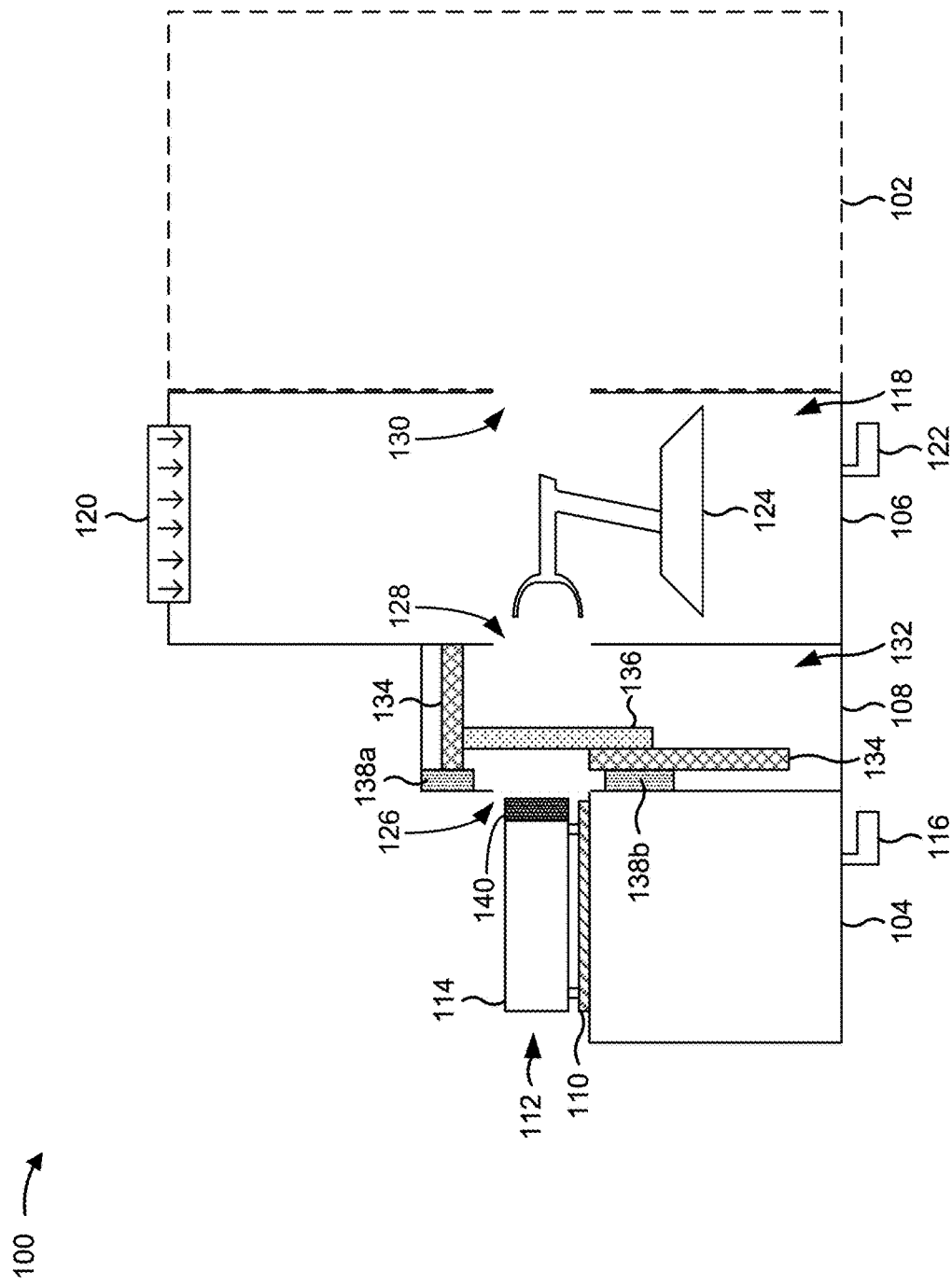
FIG. 1 is a diagram of an example semiconductor processing environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A plurality of semiconductor wafers and/or other types of substrates may be transported throughout a semiconductor fabrication facility in a transport carrier. A transport carrier may include a wafer cassette, a front-opening unified pod (FOUP), a pod, a container, or a similar type of device. To transfer a semiconductor wafer from a transport carrier to a semiconductor processing tool, the transport carrier may be placed in and/or on a load port associated with the semiconductor processing tool. A transport tool included in an interface tool (e.g., an equipment front end module (EFEM) or similar type of interface tool) that is situated between the semiconductor processing tool and the load port may remove the semiconductor wafer from the transport carrier. The transport tool may transfer the semiconductor wafer from the transport carrier to the semiconductor processing tool through a chamber of the interface tool. The transport tool may perform the above-described process in reverse to transfer the semiconductor wafer from the semiconductor processing tool to the transport carrier after processing.

Semiconductor wafers may be exposed to contaminants (e.g., volatile organic compounds (VOCs), dust, debris, and other types of contaminants) in the semiconductor fabrication facility during transfer of the semiconductor wafers between a load port and an associated semiconductor processing tool. These contaminants may cause semiconductor device failures, may cause defects to occur in the integrated circuits and/or semiconductor devices formed in the semiconductor fabrication facility, and may reduce manufacturing yield and quality, among other examples. Moreover, the impact of the contaminants in the semiconductor fabrication facility may continue to become more significant due to decreased tolerance to the contaminants as device and/or feature sizes of the integrated circuits and/or semiconductor devices, that are to be formed on semiconductor wafers in the semiconductor fabrication facility, continue to shrink.

Some implementations described herein provide a transport carrier docking device that can be positioned between a load port and an interface tool to reduce and/or minimize cross contamination of semiconductor wafers that are transferred between the load port and an associated semiconductor processing tool. The transport carrier docking device may be capable of forming an air-tight seal around a transport carrier while a front portion of the transport carrier is inserted into a chamber of the transport carrier docking device. In this way, semiconductor wafers in the transport carrier may be accessed by a transport tool while the air-tight seal around the transport carrier prevents and/or reduces the likelihood that contaminants in the semiconductor fabrication facility will reach the semiconductor wafers. Accordingly, the air-tight seal around the transport carrier may reduce defects of the semiconductor wafers that might otherwise be caused by the contaminants, may increase manufacturing yield and quality in the semiconductor fabrication facility, and/or may permit the continued reduction in device and/or feature sizes of integrated circuits and/or semiconductor devices that are to be formed on semiconductor wafers.

FIG. 1 is a diagram of an example semiconductor processing environment 100 described herein. The example semiconductor processing environment 100 may include, or may be included in, a semiconductor fabrication facility, a semiconductor foundry, a semiconductor processing facility, a semiconductor clean room, and/or another environment in which semiconductor wafers and/or devices are processed. As shown in FIG. 1, the example semiconductor processing environment 100 may include a semiconductor processing tool 102, a load port 104, an interface tool 106, and a docking device 108, among other tools and/or devices.

The semiconductor processing tool 102 may include one or more tools configured to perform one or more semiconductor processing operations on one or more semiconductor wafers and/or devices. For example, the semiconductor processing tool 102 may include a deposition tool (e.g., a semiconductor processing tool configured to deposit one or more layers onto a semiconductor wafer), a plating tool (e.g., an electroplating tool configured to deposit one or more metal layers onto a semiconductor wafer), an exposure tool (e.g., an extreme ultraviolet (EUV) tool, an electron beam (e-beam) tool), an etch tool (e.g., a wet etch tool, a dry etch tool), or another type of semiconductor processing tool.

The load port 104 may include a shuttle platform 110 configured to receive and support a transport carrier 112. The transport carrier 112 may include a wafer cassette, a FOUP, a pod, a container, or a similar type of device configured to hold and/or store a plurality of semiconductor wafers. The load port 104 and the shuttle platform 110 may receive the transport carrier 112 from a transport robot, a transport cart, an overhead hoist transport (OHT), or another device configured to move transport carriers to and from various locations in the example semiconductor processing environment 100. The transport carrier 112 may include a body 114 configured to rest on the shuttle platform 110. The load port 104 may further include an exhaust 116 that is configured to vent the load port 104.

The interface tool 106 may include an EFEM or another tool that includes a chamber 118. Air may be provided to the chamber 118 through a filter 120 (e.g., a high-efficiency particulate air (HEPA) filter or another type of air filter) configured to filter the incoming air of particles and other contaminants. The chamber 118 may further be vented through an exhaust 122.

The interface tool 106 may further include a wafer transport tool 124 in the chamber 118. The wafer transport tool 124 may include a robotic arm or another type of tool that is configured to transport semiconductor wafers between the transport carrier 112 and the semiconductor processing tool 102. In some implementations, the wafer transport tool 124 transfers semiconductor wafers between the transport carrier 112 and a staging area of the semiconductor processing tool 102. In some implementations, the wafer transport tool 124 transfers semiconductor wafers between the transport carrier 112 and a processing chamber of the semiconductor processing tool 102.

The docking device 108 is a device that is configured to permit the transfer of semiconductor wafers between the transport carrier 112 and the semiconductor processing tool 102 in a manner that reduces the likelihood of exposure of semiconductor wafers to contaminants that may be present in the example semiconductor processing environment 100. The docking device 108 may include an opening 126 at a first side (e.g., a first sidewall) of the docking device 108 and another opening 128 at a second side (e.g., a second sidewall) of the docking device 108. The wafer transport tool 124 may access the transport carrier 112 (e.g., the body 114 of the transport carrier 112) through the opening 126 and the opening 128. The wafer transport tool 124 may transport semiconductor wafers to and from the semiconductor processing tool 102 through an opening 130 between the interface tool 106 and the semiconductor processing tool 102. In some implementations, the opening 126 and the opening 128 are on opposing sides (e.g., opposing sidewalls) of the docking device 108. In some implementations, the opening 126 and the opening 128 are on adjacent sides (e.g., adjacent sidewalls) of the docking device 108.

The docking device 108 may include a chamber 132. The opening 126 may provide access to the chamber 132 for insertion of the transport carrier 112, and the opening 128 may provide access to the chamber 132 for the wafer transport tool 124. The chamber 132 may include a door frame 134, a chamber door 136, and a sealing component 138 to reduce, minimize, and/or eliminate the likelihood of exposure to contaminants that may be present in the example semiconductor processing environment 100 when a semiconductor wafer is transferred between the transport carrier 112 and the semiconductor processing tool 102.

The door frame 134 may include a rigid or semi-rigid structure that extends from the top of the chamber 132 to the bottom of the chamber 132, and that extends from one side of the chamber 132 to another (opposing) side of the chamber 132. An opening may be provided through the door frame 134, which may be sealed by the chamber door 136. In particular, the chamber door 136 may be pressed against the door frame 134 to form an air-tight seal between the door frame 134 and the chamber door 136. The door frame 134 and the chamber door 136 may form the air-tight seal when the chamber door 136 is in a closed position, as shown in FIG. 1. The air-tight seal may reduce, minimize, and/or eliminate the likelihood that contaminants in the example semiconductor processing environment 100 might travel through the opening 126 and through the opening in the door frame 134 when the transport carrier 112 is not inserted into the opening 126 and/or when no air-tight seal is formed around the transport carrier 112.

In some implementations, the door frame 134 and/or the chamber door 136 may include a gasket, a strip, or another component to form the air-tight seal. The gasket of the door frame 134, if included, may be formed around the opening in the door frame 134. The gasket of the chamber door 136, if included, may be formed in a shape that substantially fits around the opening in the door frame 134. The gasket of the door frame 134 and/or the gasket of the chamber door 136 may be formed of a soft material and/or of a deformable material to permit the air-tight seal to be formed. For example, the gasket of the door frame 134 and/or the gasket of the chamber door 136 may be formed of a plastic material, a rubber material, a silicone material, or a similar material. In some implementations, the material of the gasket of the door frame 134 and/or the gasket of the chamber door 136 includes a gas impermeable material.

The sealing component 138 may be pressed against the door frame 134 on an opposite side of the door frame 134 as the chamber door 136. One or more gaskets may be located between the sealing component 138 and door frame 134 to reduce, minimize, and/or prevent air (and contaminants carried by the air) from passing between the sealing component 138 and the door frame 134. Moreover, the sealing component 138 may be pressed against the side (e.g., the sidewall) of the chamber 132 on which the opening 126 is located such that an air-tight seal is formed between the side and the sealing component 138.

The sealing component 138 may include one or more portions (e.g., portion 138a, portion 138b, and/or one or more other portions) that are configured to form an air-tight seal around the transport carrier 112 when the transport carrier 112 is at least partially inserted into the opening 126. For example, the shuttle platform 110 may slide or otherwise move the transport carrier 112 toward and at least partially into the opening 126. With the transport carrier 112 at least partially inserted through the opening 126 and into the chamber 132, the sealing component 138 may contract around the transport carrier 112 (e.g., around the body 114 of the transport carrier 112) to form the air-tight seal between the sealing component 138 and the transport carrier 112.

In some implementations, the sealing component 138 (or the portions thereof) are formed of a relatively soft material (e.g., softer than the material of the body 114 of the transport carrier 112) to permit the air-tight seal to be formed around the transport carrier 112. For example, the sealing component 138 (or the portions thereof) may be formed of a plastic material, a rubber material, a silicone material, a gas impermeable, or a similar material. In some implementations, the sealing component 138 (or the portions thereof) includes a gasket, a strip, or a similar component formed of a relatively soft material that is pressed against the body 114 of the transport carrier 112 to form the air-tight seal.

When the air-tight seal is formed between the sealing component 138 and the transport carrier 112, the chamber door 136 may remove a carrier door 140 from the body 114 of the transport carrier 112. After removing the carrier door 140, the chamber door 136 may transition from the closed position shown in FIG. 1 to an open position, which releases the air-tight seal between door frame 134 and the chamber door 136. Here, the chamber door 136 (with the removed carrier door 140) may move backwards away from the door frame 134 toward the opening 128, and may move downward into the chamber 132 (e.g., after moving backwards away from the door frame 134). In this way, the opening in the door frame 134 is cleared such that the wafer transport tool 124 is permitted to access the transport carrier 112 (e.g., the body 114 of the transport carrier 112) through the opening in the door frame 134 and the opening 128.

The wafer transport tool 124 may transfer semiconductor wafers between the transport carrier 112 and the semiconductor processing tool 102 after the air-tight seal is formed around the transport carrier 112 by the sealing component 138, and after the chamber door 136 is opened. For example, the wafer transport tool 124 may obtain and/or retrieve a semiconductor wafer from the transport carrier 112 through the opening in the door frame 134 and through the opening 128, and may provide the wafer to the semiconductor processing tool 102 through the opening 130. As another example, the wafer transport tool 124 may obtain a semiconductor wafer from the semiconductor processing tool 102 through the opening 130, and may provide the semiconductor wafer to the transport carrier 112 through the opening 128 and the opening in the door frame 134.

In this way, with the carrier door 140 removed and the chamber door 136 in the open position, air-tight seals are formed between the sidewall on which the opening 126 is located and the sidewall on which the opening 128 is located. In particular, an air-tight seal may be formed between the transport carrier 112 and the sealing component 138, an air-tight seal may be formed between the sealing component 138 and the wall of the chamber 132 on which the opening 126 is located, an air-tight seal may be formed between the sealing component 138 and the door frame 134, and an air-tight seal may be formed between the door frame 134 and the top, bottom, and sides of the chamber 132. This provides an air-tight seal through the chamber 132 between the opening 126 and the opening 128. The air-tight seal through the chamber 132 between the opening 126 and the opening 128 permits the transport carrier 112 to be accessed without exposing the semiconductor wafers that are between the transport carrier 112 and the semiconductor processing tool 102.

As indicated above, FIG. 1 is provided as an example. Other examples may differ from what is described with regard to FIG. 1.

Figure 2C:
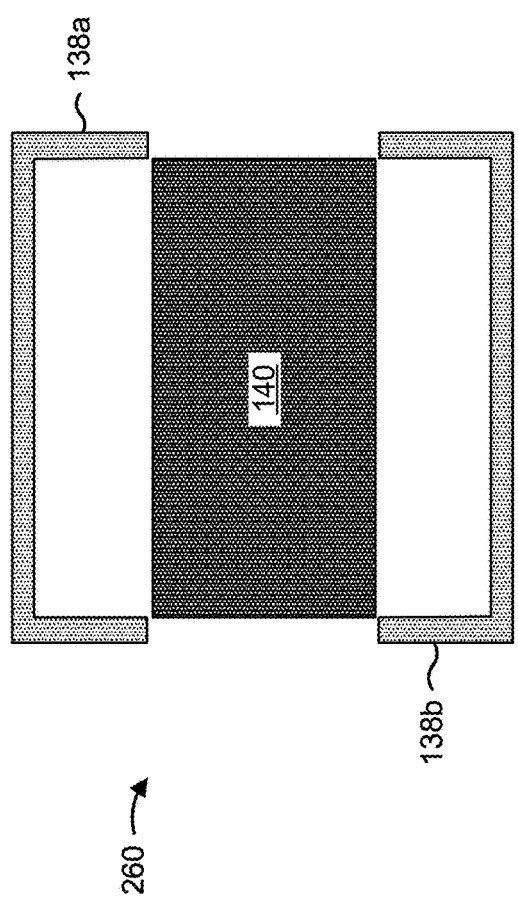

FIGS. 2A-2F are diagrams of example implementations of the sealing component 138 for forming an air-tight seal around a transport carrier 112 described herein. FIG. 2A illustrates perspective views of example implementations 210 and 220 of the sealing component 138 in which the sealing component 138 includes two portions: a portion 138a and portion 138b. Example implementation 210 illustrates an example of the sealing component 138 in an expanded configuration, where the portion 138a and the portion 138b are not contracted around the body 114 of the transport carrier 112. In this configuration, the portion 138a and the portion 138b may spaced away from the body 114 of the transport carrier 112 at a distance that permits the carrier door 140 and the body 114 of the transport carrier 112 to fit through the opening formed by the portion 138a and the portion 138b.

As further shown in the example implementation 220 in FIG. 2A, the sealing component 138 may transition to a contracted configuration, in which the portion 138a and the portion 138b are contracted around the body 114 of the transport carrier 112 to form the air-tight seal around the transport carrier 112.

FIG. 2B illustrates an elevation view of an example implementation 230, which shows a first position 240 of the portions 138a and 138b, and a second position 250 of the portions 138a and 138b. The first position 240 may correspond to the expanded configuration illustrated in the example implementation 210 of FIG. 2A, and the second position 250 may correspond to the contracted configuration illustrated in the example implementation 220 of FIG. 2A. As shown in FIG. 2B, in some implementations, the portion 138a and the portion 138b may each transition between the first position 240 and the second position 250 in a diagonal path of travel. For example, the portion 138a may move downward and inward in a diagonal path of travel from the first position 240 to the second position 250, and may move upward and outward in a diagonal path of travel from the second position 250 to the first position 240. As another example, the portion 138b may move upward and inward in a diagonal path of travel from the first position 240 to the second position 250, and may move downward and outward in a diagonal path of travel from the second position 250 to the first position 240.

As further shown in FIG. 2B, in the example implementation 230, the portion 138a may cover substantially the entire top of the transport carrier 112 and substantially an entire first side of the transport carrier 112. The portion 138b may cover substantially the entire bottom of the transport carrier 112 and substantially an entire second side of the transport carrier 112 opposing the first side.

FIG. 2C illustrates an elevation view of an example implementation 260. In the example implementation 260, the sealing component 138 includes a plurality of portions: a portion 138a and a second portion 138b. The portion 138a may cover substantially the entire top of the transport carrier 112, a first portion of a first side of the transport carrier 112, and a first portion of a second side of the transport carrier 112 opposing the first side. The portion 138b may cover substantially the entire bottom of the transport carrier 112, a second portion of the first side of the transport carrier 112, and a second portion of the second side of the transport carrier 112. The first portion of the first side covered by the portion 138a, and the second portion of the first side covered by the portion 138b may substantially encompass the entire first side of the transport carrier 112. The first portion of the second side covered by the portion 138a, and the second portion of the second side covered by the portion 138b may substantially encompass the entire second side of the transport carrier 112.

Figure 2D:
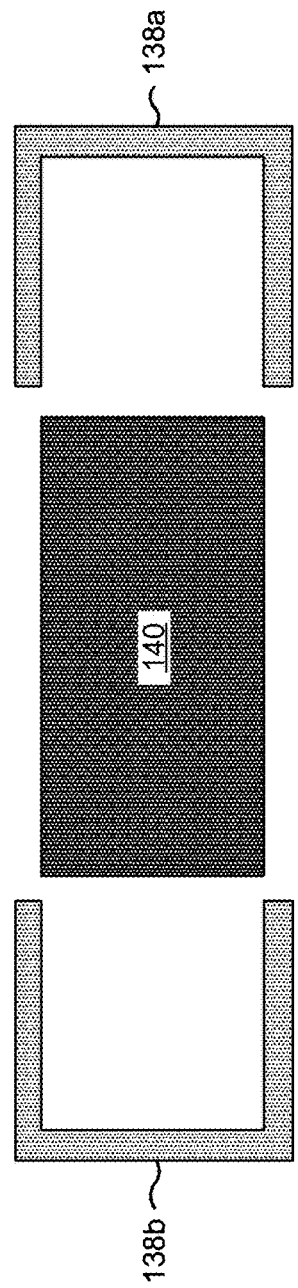

FIG. 2D illustrates an elevation view of an example implementation 270. In the example implementation 270, the sealing component 138 includes a plurality of portions: a portion 138a and a second portion 138b. The portion 138a may cover substantially an entire first side of the transport carrier 112, a first portion of the top of the transport carrier 112, and a first portion of the bottom of the transport carrier 112. The portion 138b may cover substantially an entire second side of the transport carrier 112 opposing the first side, a second portion of the top of the transport carrier 112, and a second portion of the bottom of the transport carrier 112. The first portion of the top covered by the portion 138a, and the second portion of the top covered by the portion 138b may substantially encompass the entire top of the transport carrier 112. The first portion of the bottom covered by the portion 138a, and the second portion of the bottom covered by the portion 138b may substantially encompass the entire bottom of the transport carrier 112.

FIG. 2E illustrates an elevation view of an example implementation 280. In the example implementation 280, the sealing component 138 includes a plurality of portions: a portion 138a, a portion 138b, and a portion 138c. The portion 138a may cover a first portion of the top of the transport carrier 112 and substantially an entire first side of the transport carrier 112. The portion 138b may cover a second portion of the top side of the transport carrier 112 and substantially an entire second side of the transport carrier 112 opposing the first side. The portion 138c may cover the entire bottom of the transport carrier 112. Other example implementations of the sealing component 138 having three portions may be used with the docking device 108.

FIG. 2F illustrates an elevation view of an example implementation 290. In the example implementation 290, the sealing component 138 includes a plurality of portions: a portion 138a, a portion 138b, a portion 138c, and a portion 138d. The portion 138a may cover substantially the entire top of the transport carrier 112. The portion 138b may cover substantially the entire bottom of the transport carrier 112. The portion 138c may cover substantially an entire first side of the transport carrier 112. The portion 138d may cover substantially an entire second side of the transport carrier 112 opposing the first side. Other example implementations of the sealing component 138 having four portions may be used with the docking device 108.

As indicated above, FIGS. 2A-2F are provided as examples. Other examples may differ from what is described with regard to FIGS. 2A-2F. In some implementations, the sealing component 138 may include five or more portions in various configurations different from those described herein.

Figure 3:
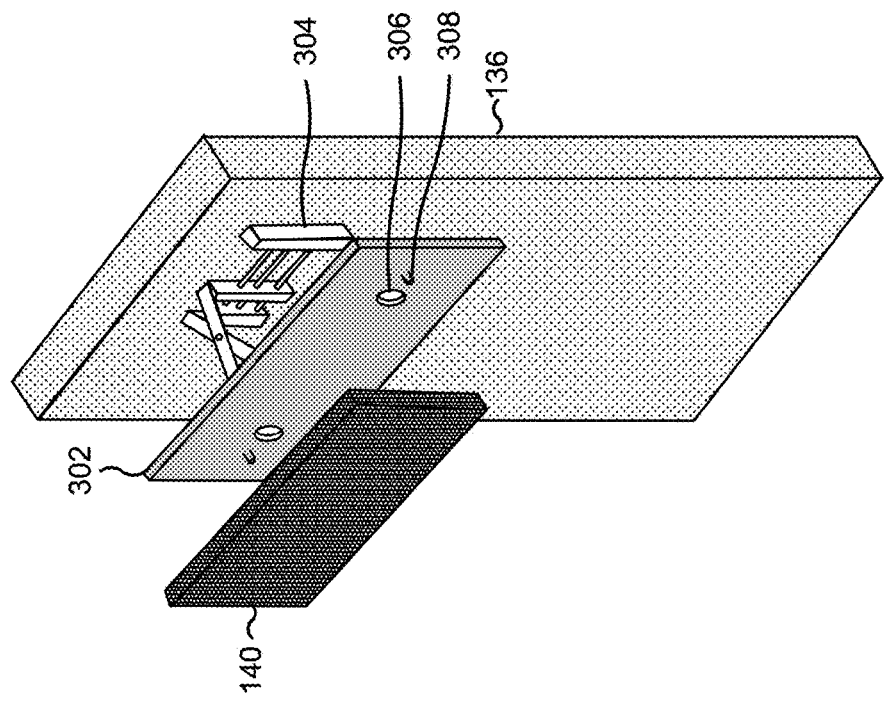
FIG. 3 is a diagram of an example chamber door described herein.

FIG. 3 is a diagram of an example 300 of the chamber door 136 described herein. As shown in FIG. 3, the chamber door 136 may include an elongated body. Moreover, the chamber door 136 may include a mounting plate 302 attached, connected, and/or otherwise mounted to a support structure 304. The support structure 304 may be attached, connected, and/or otherwise mounted to the elongated body of the chamber door 136. The mounting plate 302 and the support structure 304 may be attached, connected, and/or otherwise mounted to a side of the elongated body of the chamber 132 that faces the door frame 134 in the chamber 132 of the docking device 108.

The mounting plate 302 may be configured to remove the carrier door 140 from the body 114 of the transport carrier 112, may be configured to hold and/or support the carrier door 140 of the transport carrier 112 when the chamber door 136 moves between the closed position and the open position, and/or may be configured to place the carrier door 140 onto the body 114 of the transport carrier 112. The mounting plate 302 may include one or more vacuum holes 306 and one or more latch keys 308. The vacuum holes 306 may be connected to tube(s), plumbing fixture(s), and/or one or more other components that are configured to pull air through the vacuum holes 306 to form a negative pressure on the face of the mounting plate 302 near the vacuum holes 306. The negative pressure may form a suction or a vacuum seal between the mounting plate 302 and the carrier door 140. The mounting plate 302 may hold and/or support the carrier door 140 based on the negative pressure generated through the vacuum holes 306.

The latch key(s) 308 may be configured to unlatch the carrier door 140 from the body 114 of the transport carrier 112. For example, the latch key(s) 308 may include a key, an elongated member, or another component that is configured to open a door latch and/or a door lock on the carrier door 14. In some implementations, the mounting plate 302 includes a single latch key 308 (e.g., on a side of the mounting plate 302 or substantially near a center of the mounting plate 302). In some implementations, the mounting plate 302 includes a plurality of latch keys 308 substantially near one or more edges of the mounting plate 302.

The support structure 304 may include a jack (e.g., a scissor jack, a hydraulic jack, a pneumatic jack, or another type of jack), a screw mechanism, a rail system, or another type of structure configured to extend the mounting plate 302 away from the elongated body of the chamber door 136 and contract the mounting plate 302 toward the elongated body of the chamber door 136. In this way, the support structure 304 may extend the mounting plate 302 toward the carrier door 140 to remove the carrier door 140 from the transport carrier 112, may contract the mounting plate 302 after removing the carrier door 140 so that the chamber door 136 may be moved to the opened position, and may extend the mounting plate 302 toward transport carrier 112 to place the carrier door 140 onto the transport carrier 112.

As indicated above, FIG. 3 is provided as an example. Other examples may differ from what is described with regard to FIG. 3.

Figure 4B:
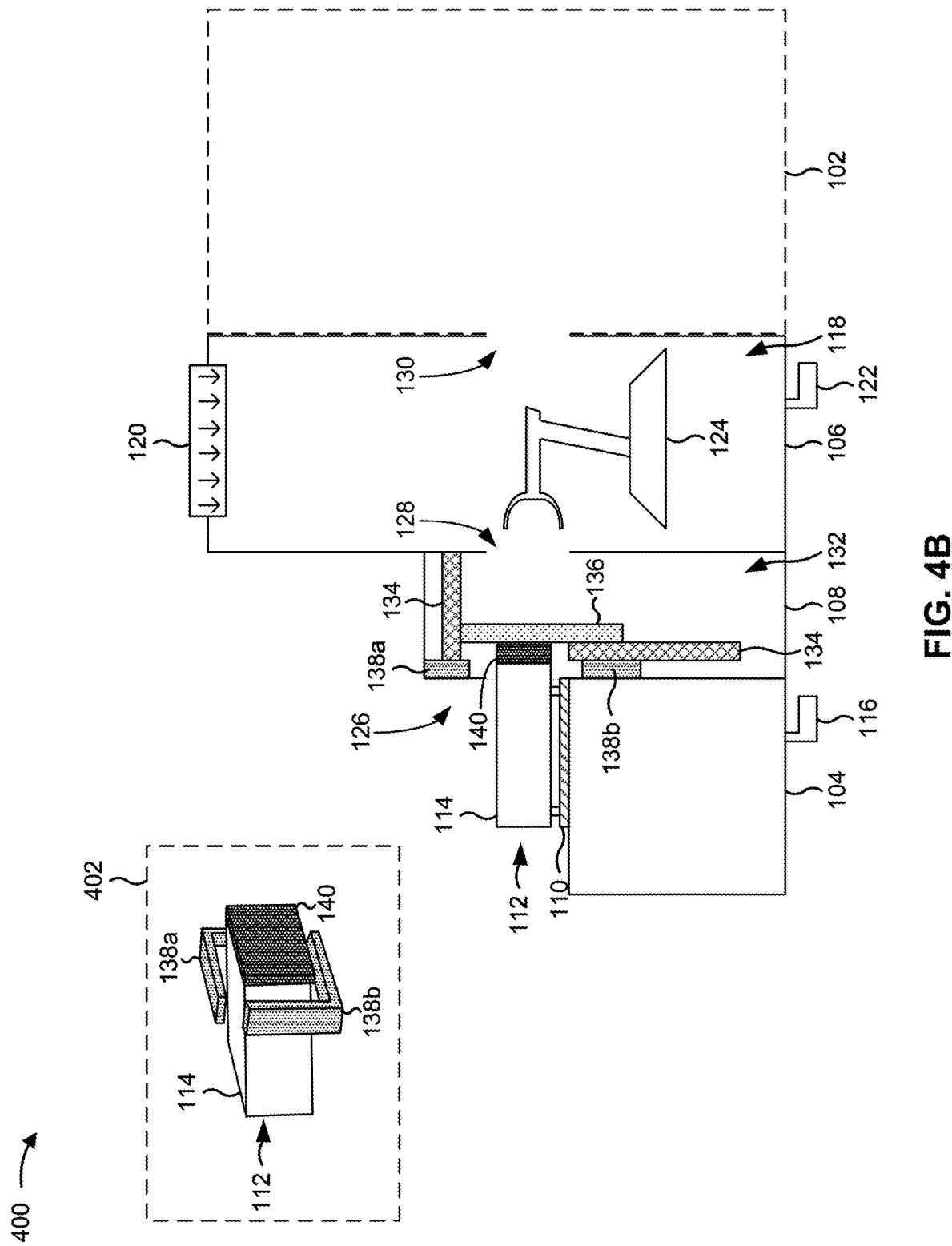
FIGS. 4A-4N are diagrams of one or more example implementations described herein.
Figure 4C:
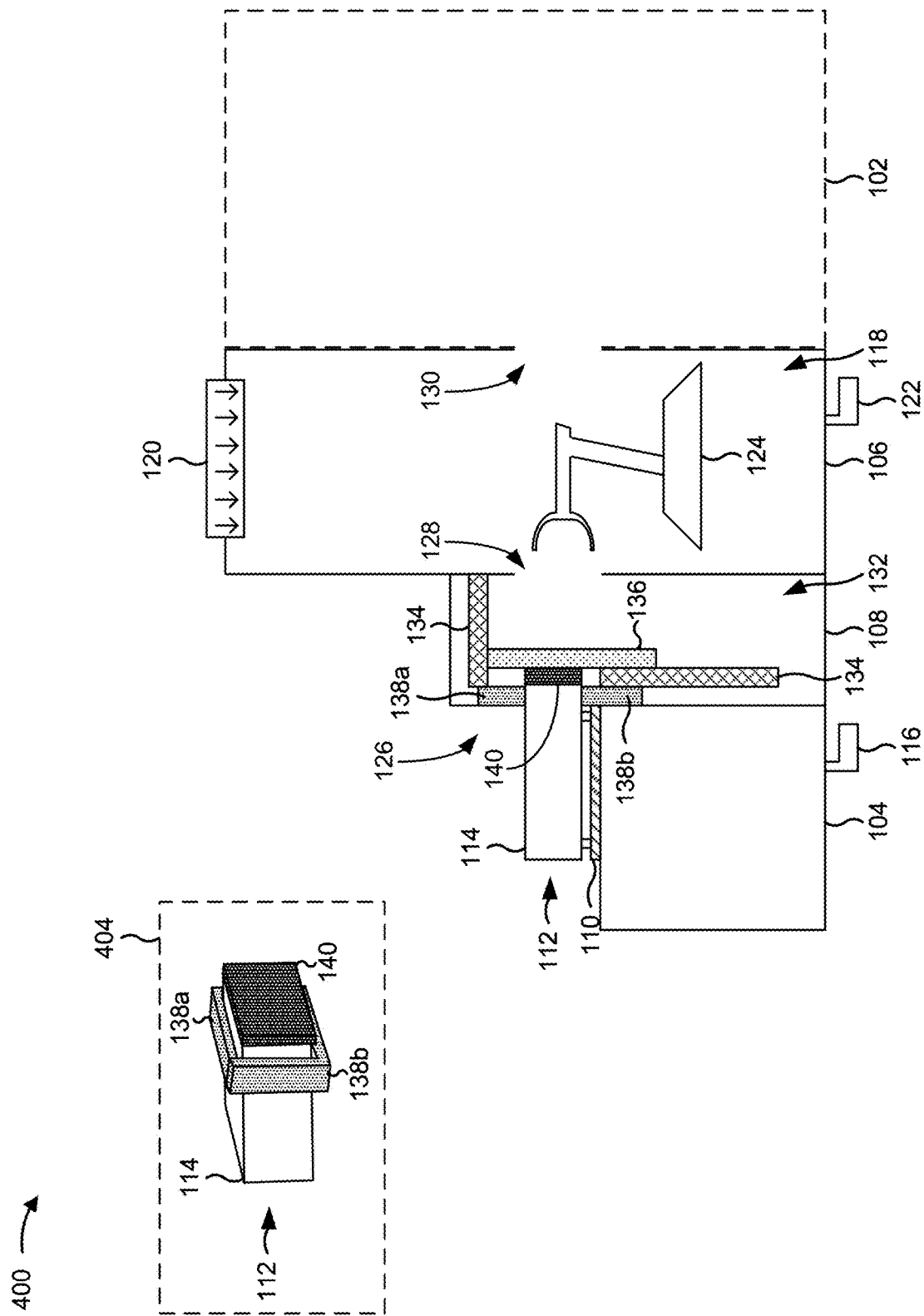
Figure 4D:
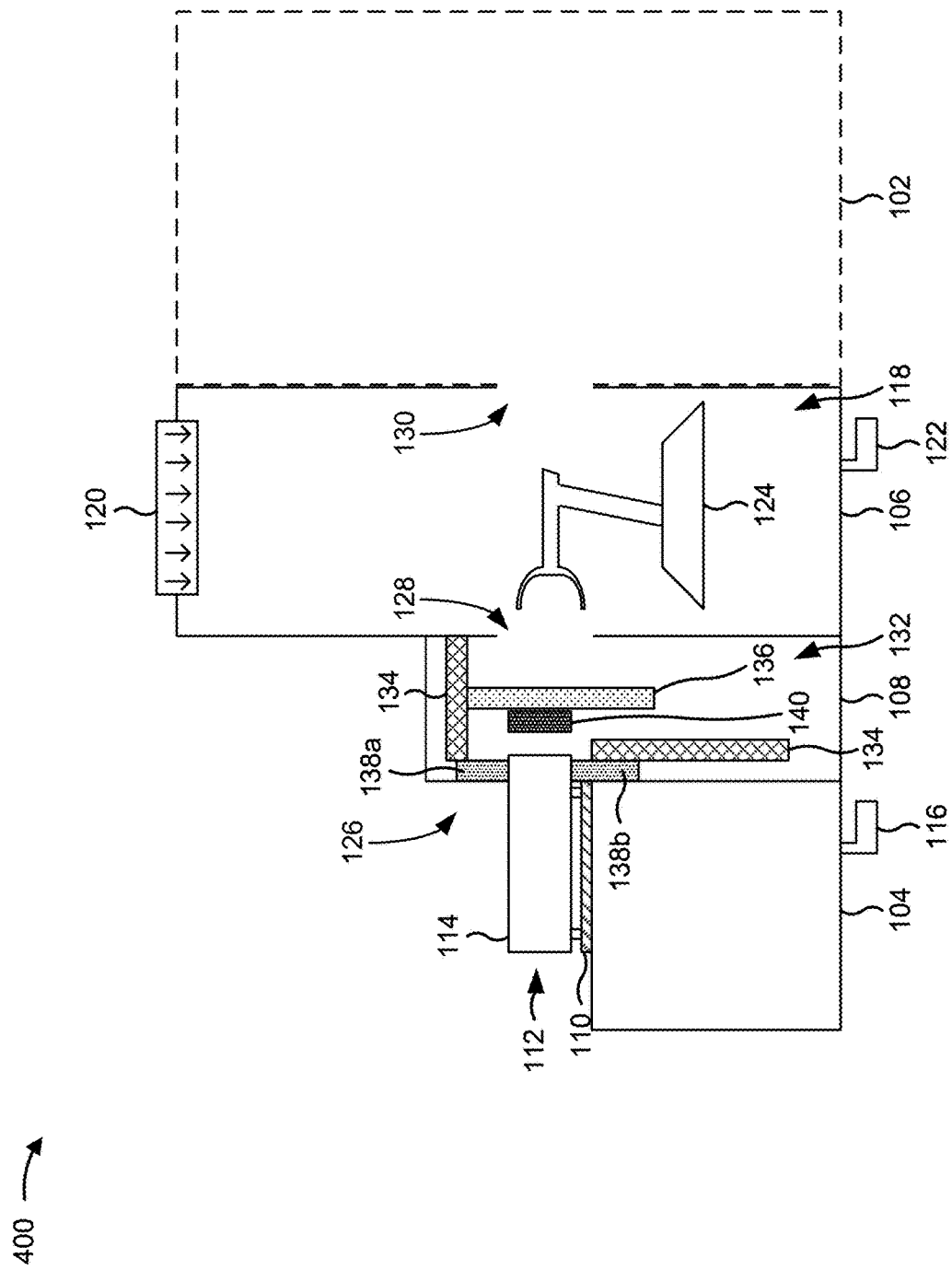
Figure 4E:
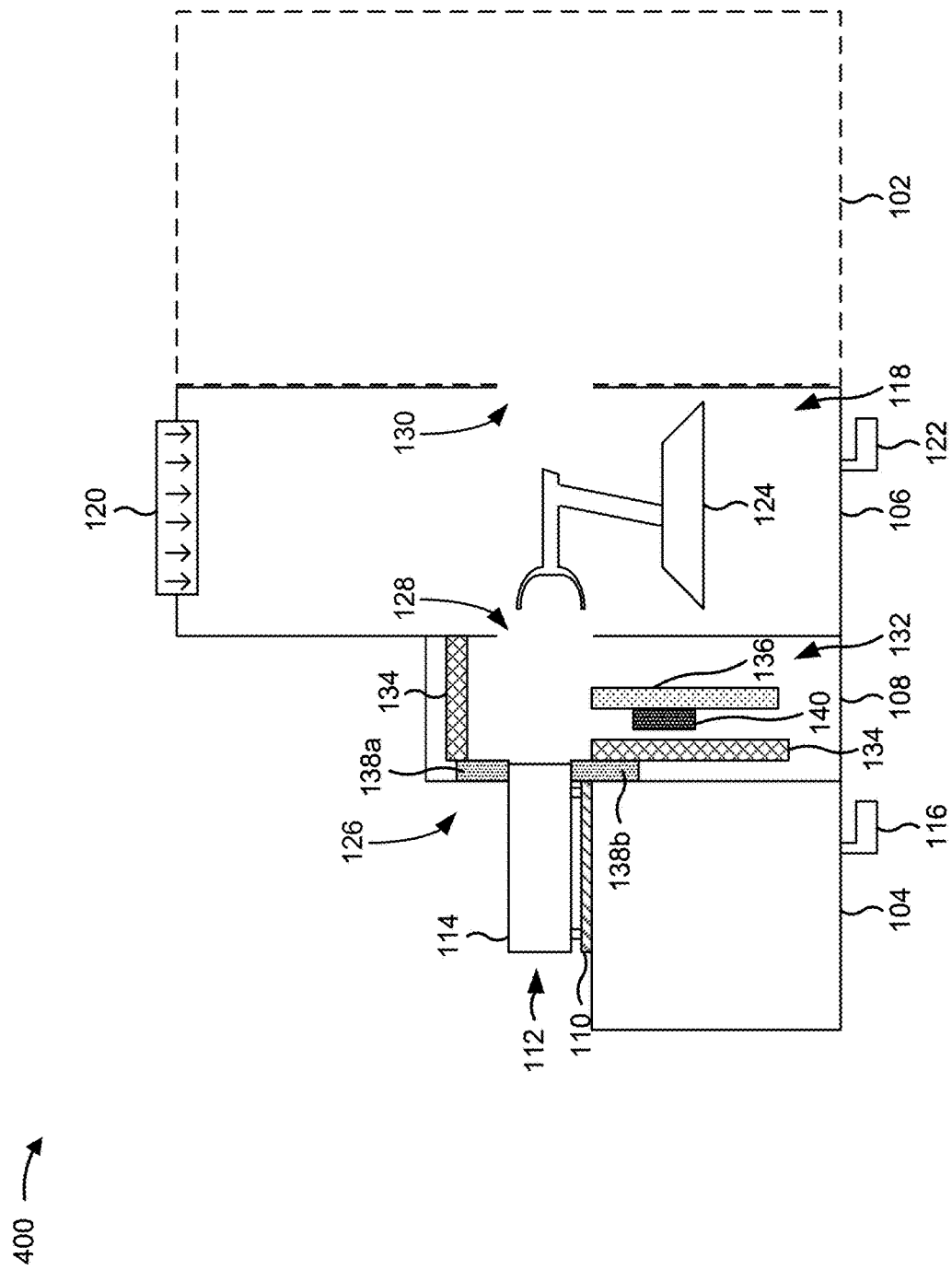
Figure 4F:
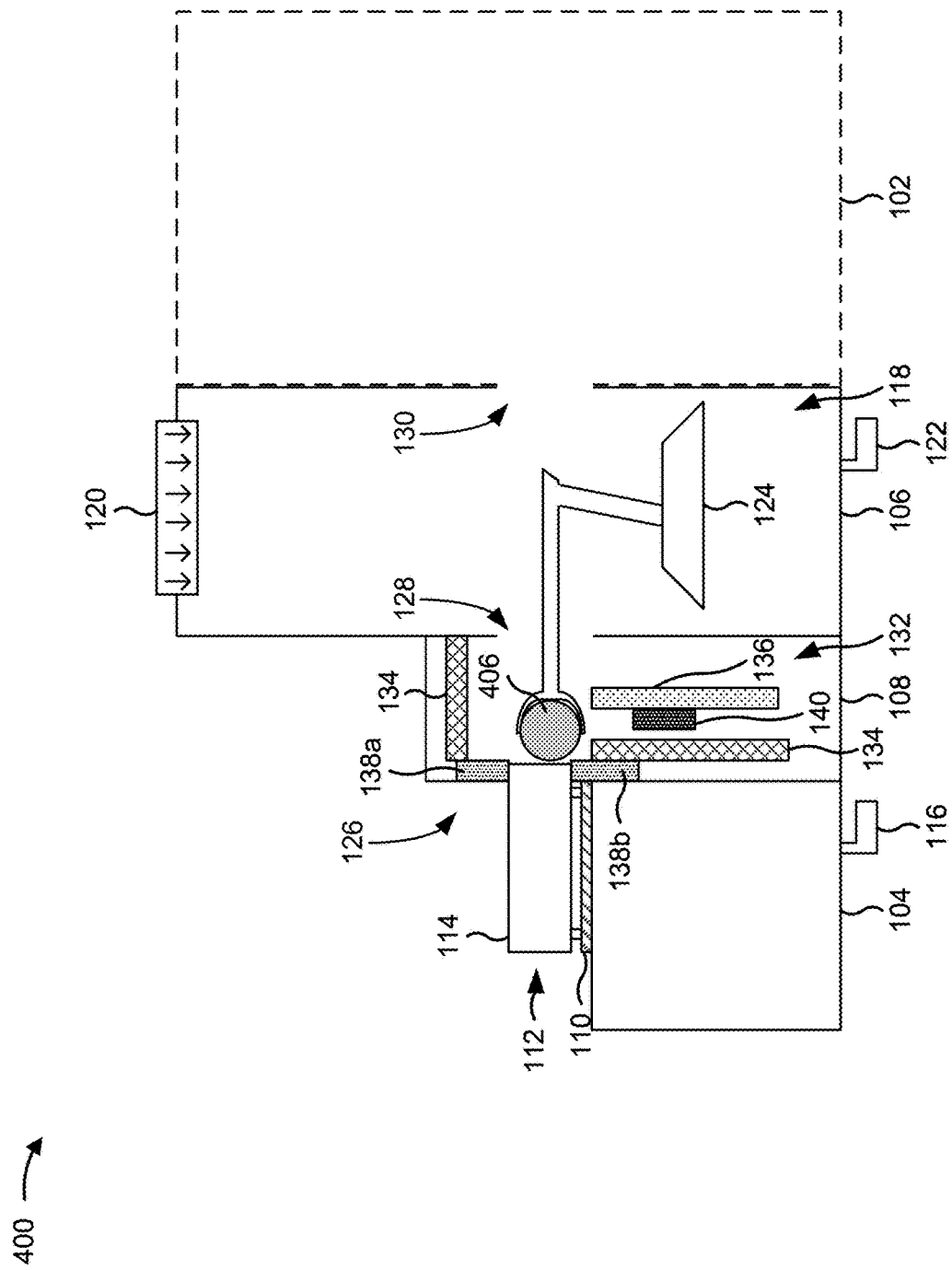
Figure 4G:
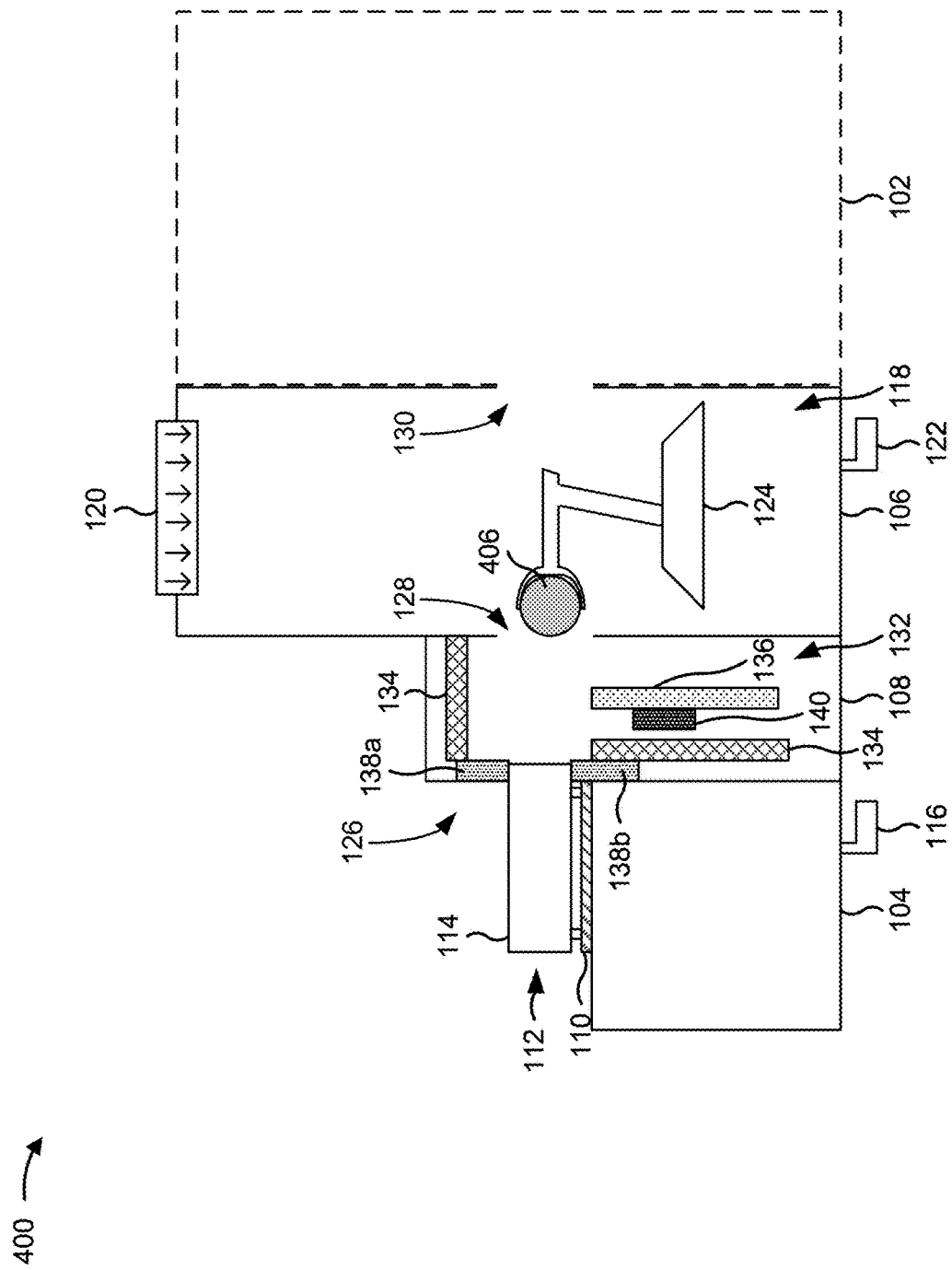
Figure 4H:
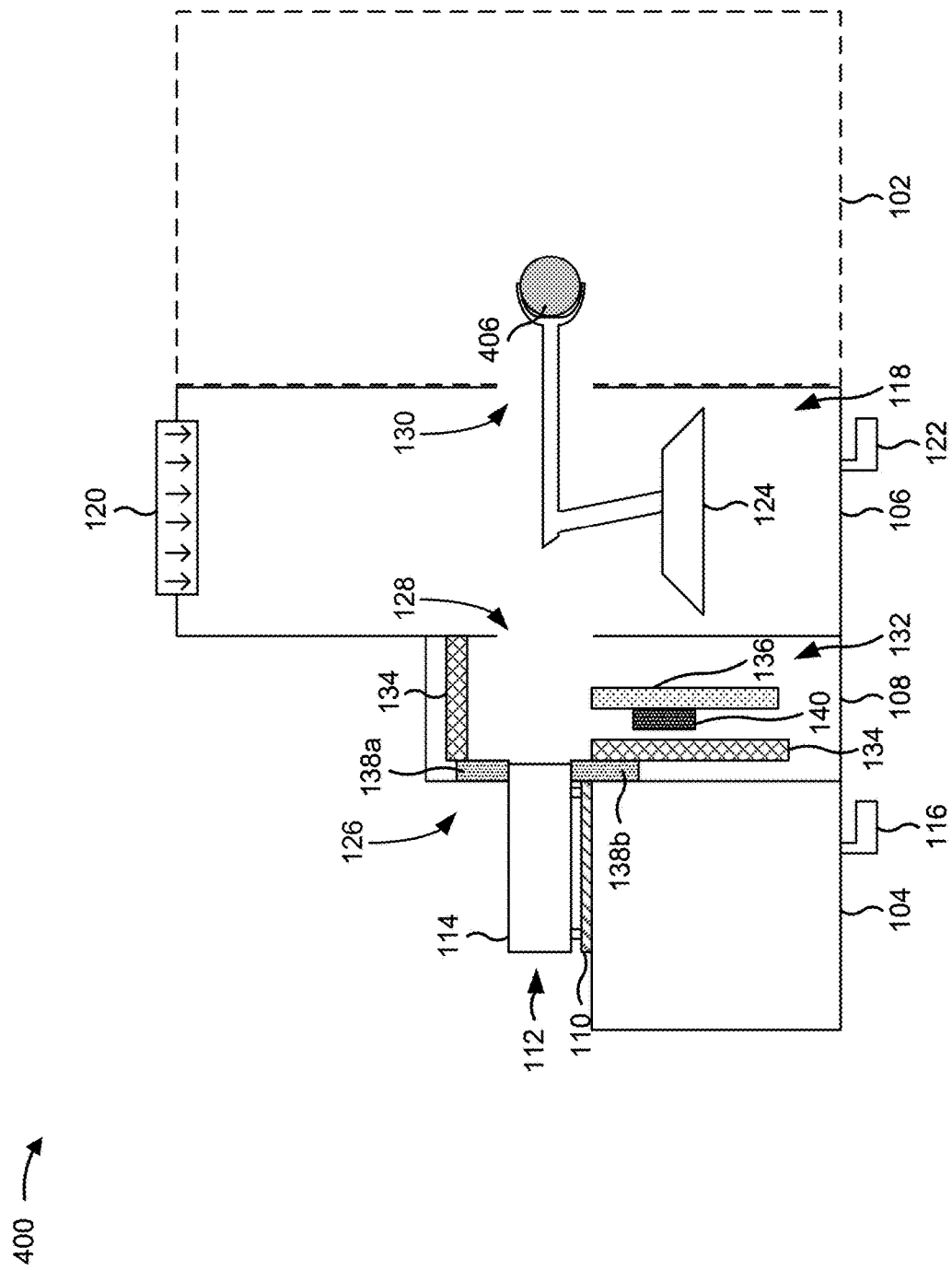
Figure 4I:
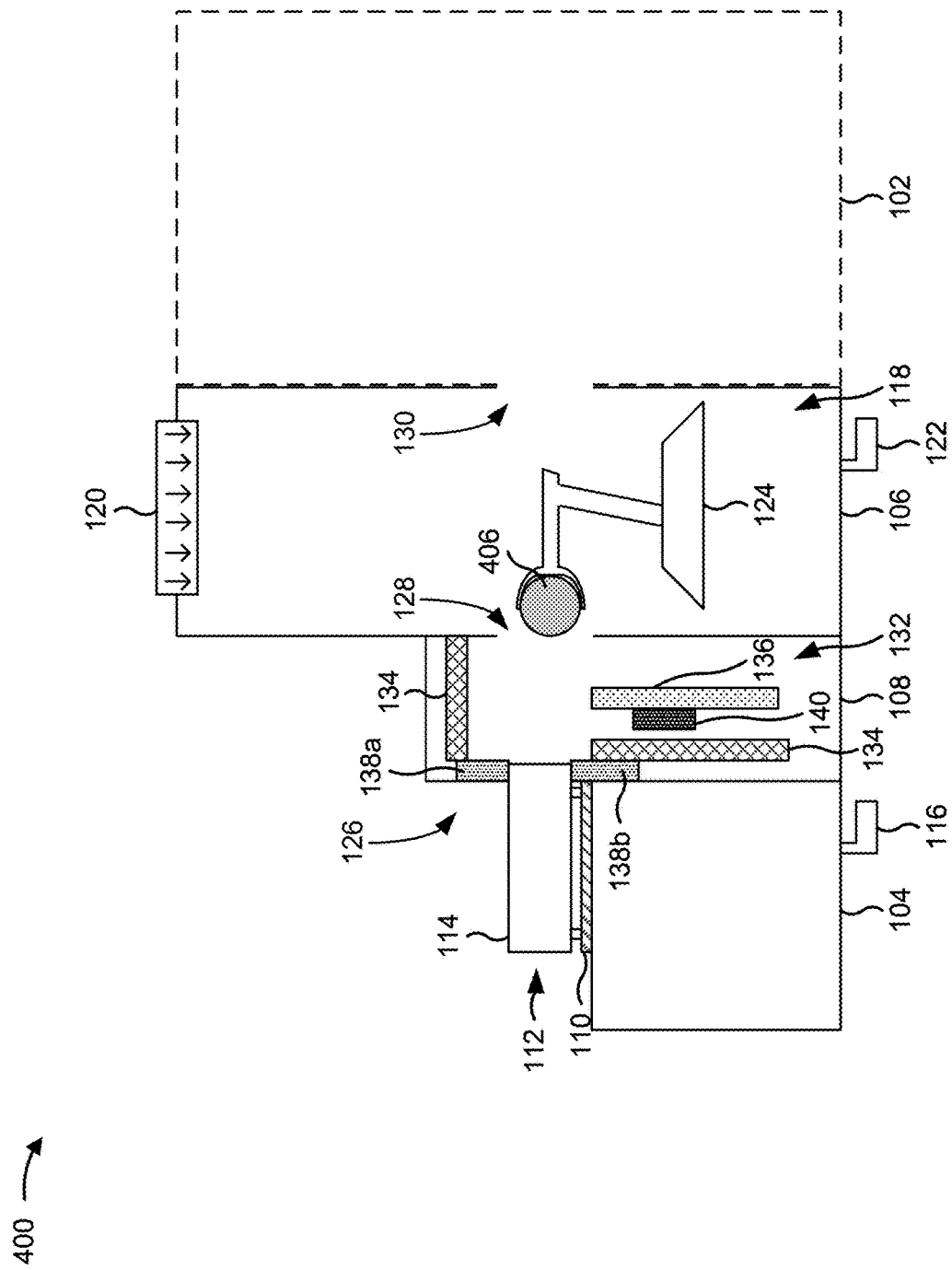
Figure 4J:
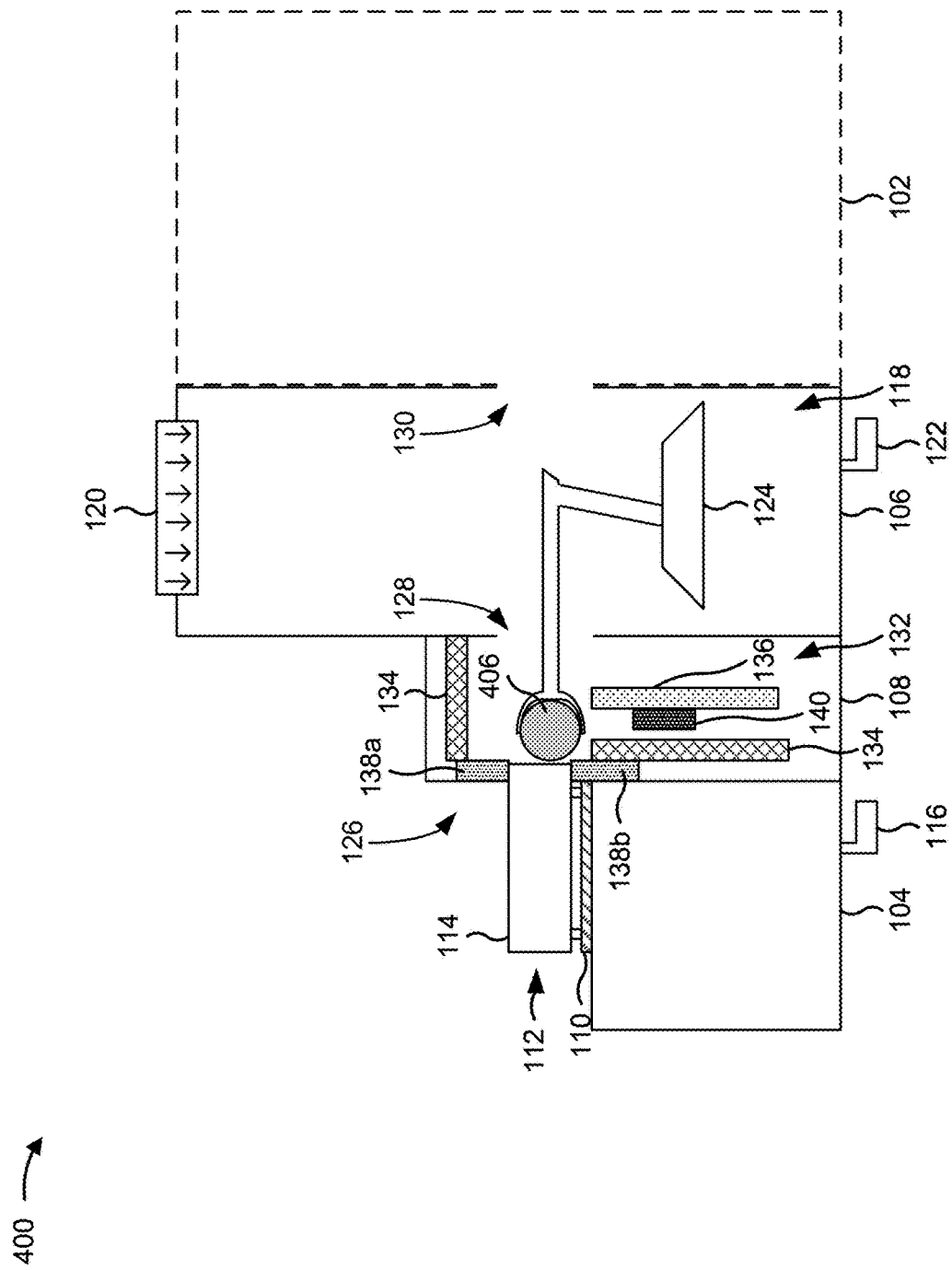
Figure 4K:
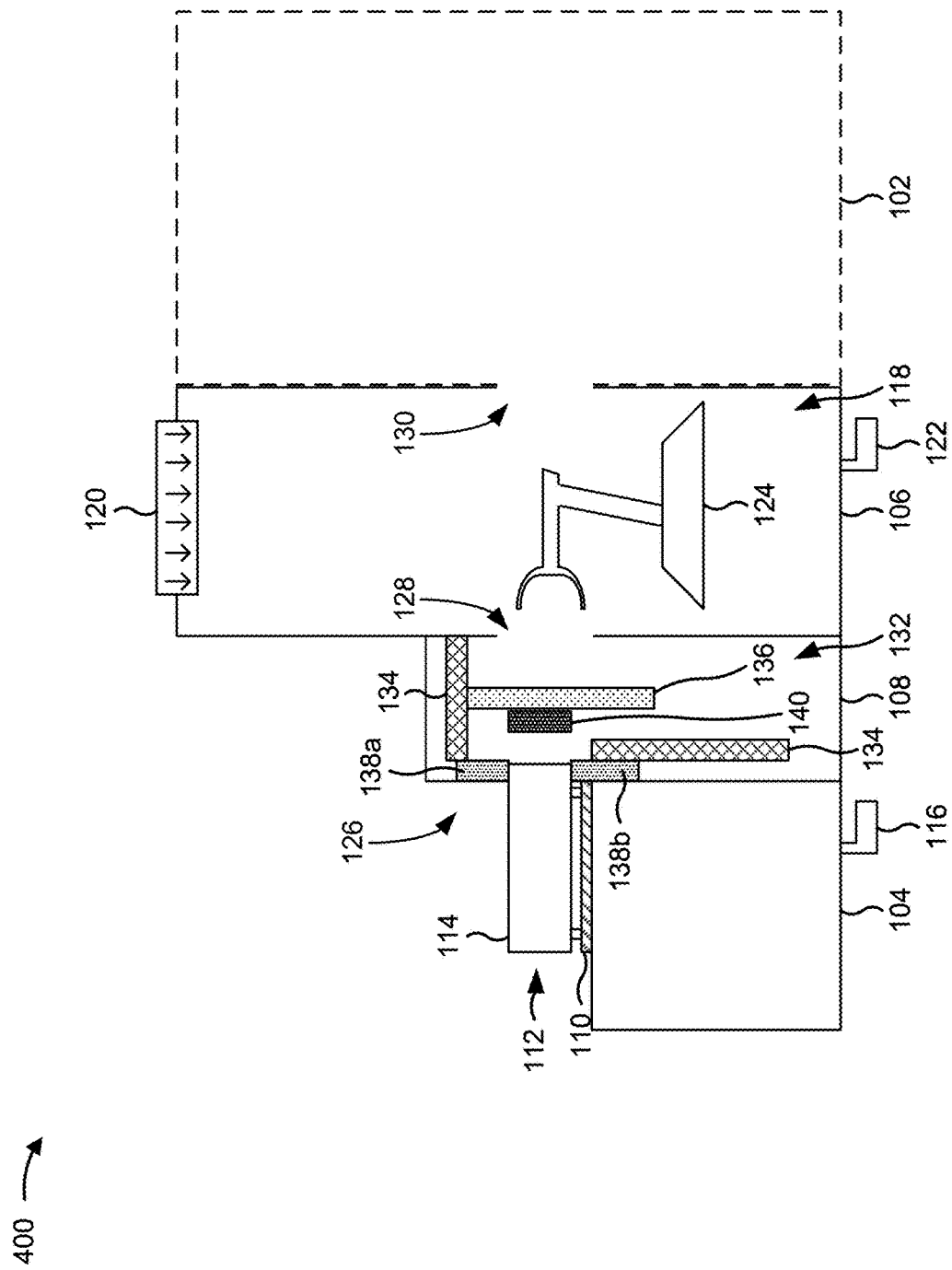
Figure 4L:
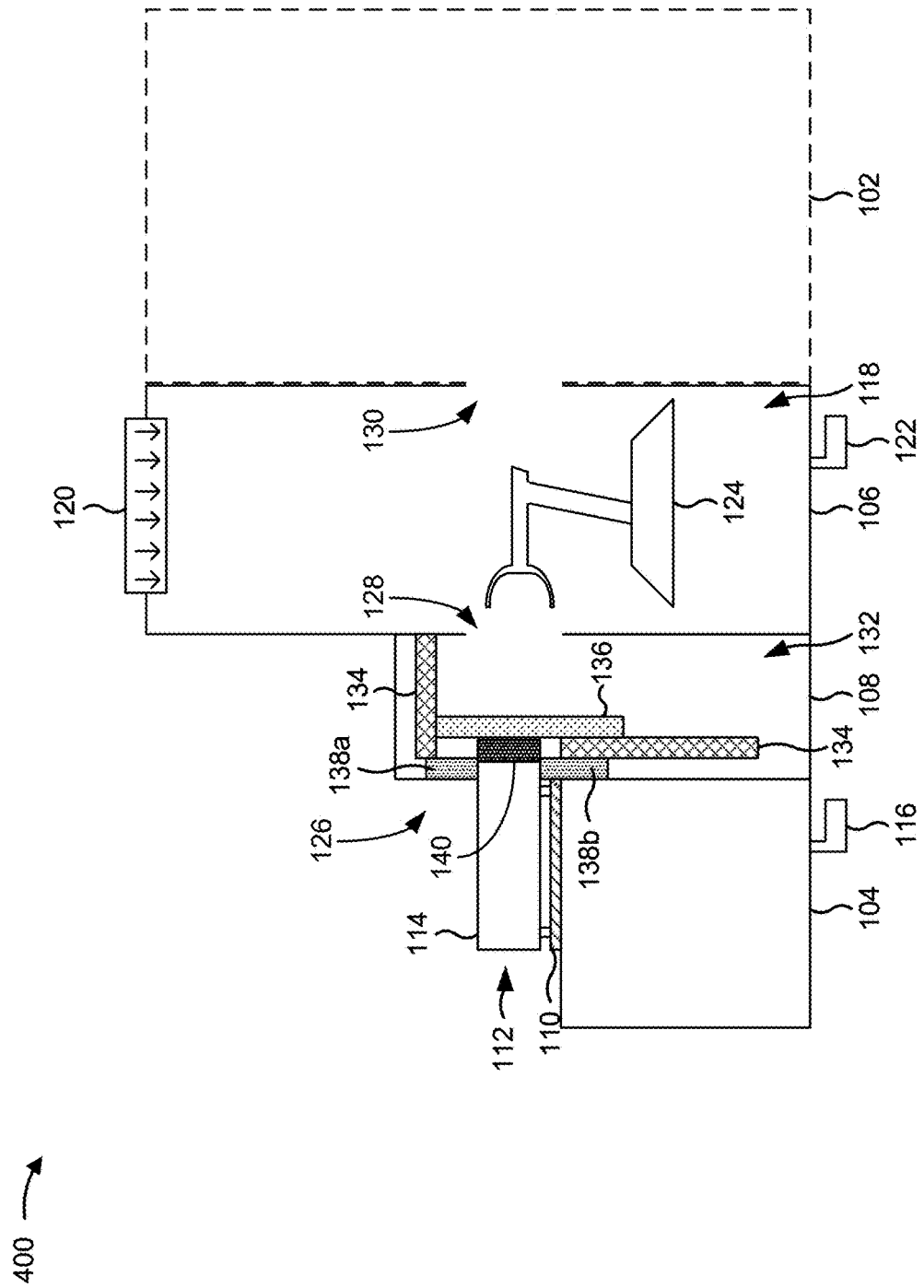
Figure 4M:
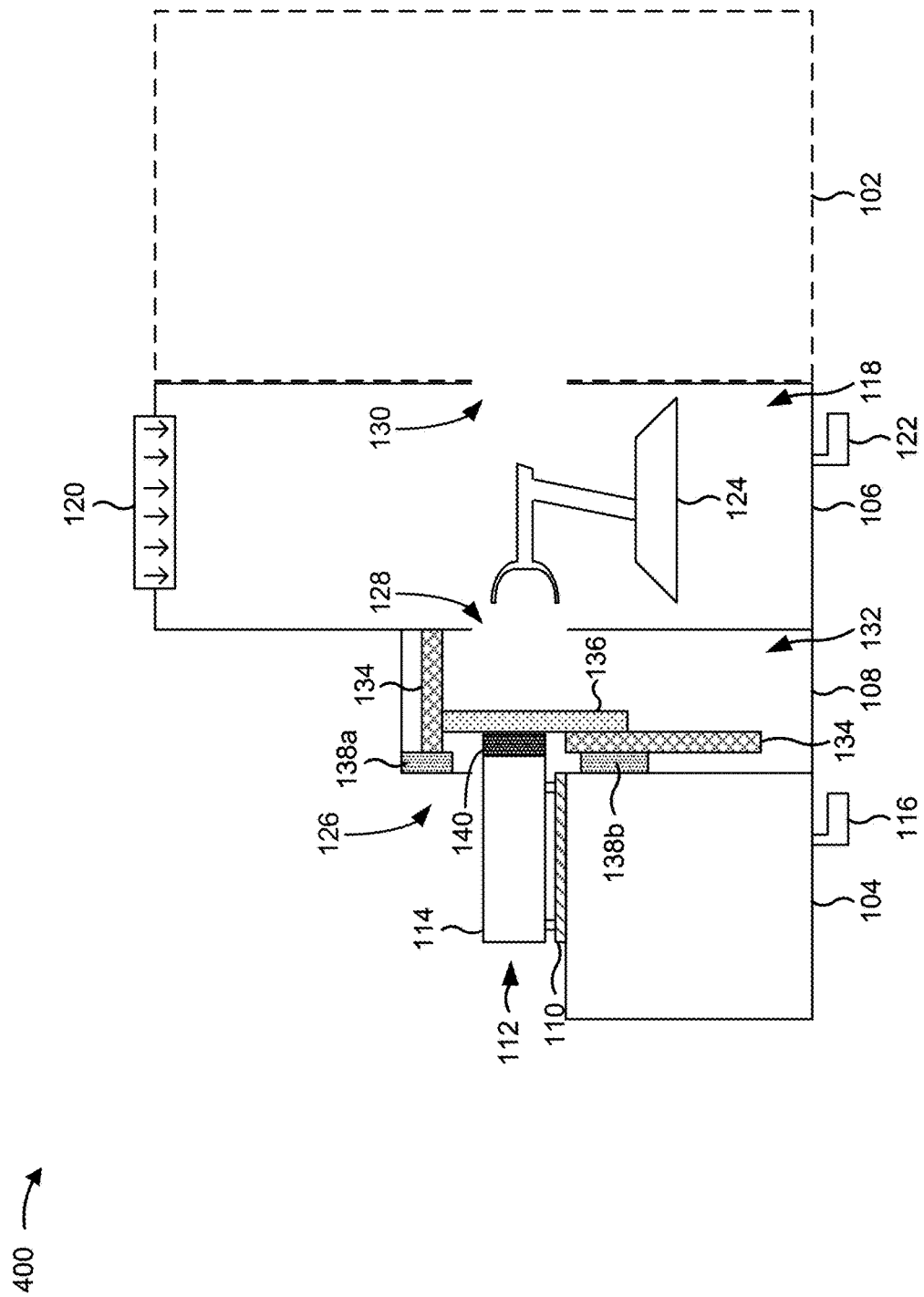
Figure 4N:
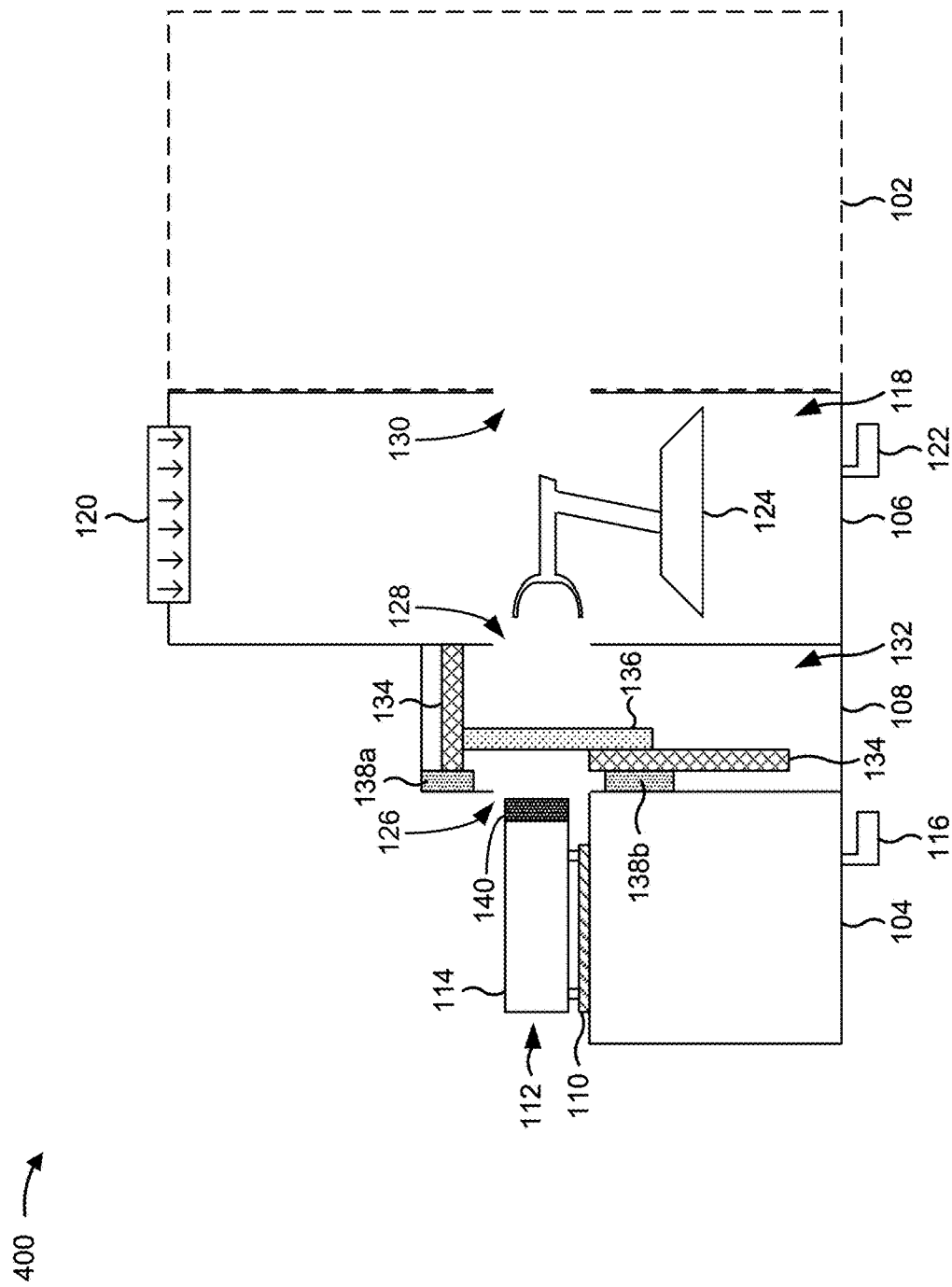

FIGS. 4A-4N are diagrams of one or more example implementations 400 described herein. The example implementation(s) 400 may include one or more example implementations illustrating various operations of the docking device 108 and other tools included in the example semiconductor processing environment 100. As shown in FIG. 4A, a transport carrier 112 may be placed on the shuttle platform 110 of the load port 104. For example, a mobile robot, an OHT, or another transport tool may place the transport carrier 112 on the shuttle platform 110.

As shown in FIG. 4B, the shuttle platform 110 may slide or otherwise move toward the opening 126 in the docking device 108 such that the transport carrier 112 is at least partially inserted into the chamber 132 of the docking device 108 through the opening 126. The shuttle platform 110 may slide or otherwise move toward the opening 126 in the docking device 108 such that the carrier door 140 of the transport carrier 112 is fully inserted into the chamber 132 of the docking device 108 through the opening 126, and such that the body 114 of the transport carrier 112 is at least partially inserted into the chamber 132 of the docking device 108 through the opening 126.

As shown in the close-up view 402 in FIG. 4B, the carrier door 140 clears the width or thickness of the sealing component 138 when the transport carrier 112 is at least partially inserted into the chamber 132. As further shown in the close-up view 402 in FIG. 4B, the portions 138a and 138b of the sealing component 138 may be in the first position 240 (e.g., the expanded configuration) when the transport carrier 112 is at least partially inserted into the chamber 132 of the docking device 108 through the opening 126 to provide clearance between the transport carrier 112 and the sealing component 138.

As shown in FIG. 4C, with the transport carrier 112 at least partially inserted into the chamber 132 through the opening 126, the sealing component 138 may contract around the transport carrier 112 to form an air-tight seal around the transport carrier 112. In particular, the air-tight seal may be formed between the sealing component 138 and the transport carrier 112, and may be formed between the side of the chamber 132 (e.g., the sidewall) on which the opening 126 is located and the sealing component 138. In this way, the opening 126 is sealed to reduce, minimize, and/or eliminate the flow of contaminants from the example semiconductor processing environment 100 through the opening 126 and into the chamber 132. As shown in the close-up view 404 in FIG. 4C, the portions 138a and 138b may contract around the transport carrier 112 by transitioning from the first position 240 (e.g., the expanded configuration) to the second position 250 (e.g., the contracted configuration).

As shown in FIG. 4D, with the air-tight seal formed around the transport carrier 112 by the sealing component 138, the chamber door 136 may remove the carrier door 140 from the transport carrier 112. For example, the support structure 304 may extend the mounting plate 302 toward the carrier door 140 through the opening in the door frame 134. The one or more latch keys 308 on the mounting plate 302 may unlatch the carrier door 140 from the body 114 of the transport carrier 112. The vacuum holes 306 on the mounting plate 302 may form a vacuum seal between the carrier door 140 and the mounting plate 302. With the vacuum seal formed, the support structure 304 may contract the mounting plate 302 (with the carrier door 140 supported and/or held thereon) toward the chamber door 136.

As further shown in FIG. 4D, the chamber door 136 may slide and/or otherwise move backward away from the door frame 134 and toward the opening 128, which removes the air-tight seal between door frame 134 and the chamber door 136. In particular, the chamber door 136 may slide and/or otherwise move backward away from the door frame 134 and toward the opening 128 after removing the carrier door 140 from the transport carrier 112 and contracting the mounting plate 302 toward the chamber door 136. The chamber door 136 may slide and/or otherwise move backward away from the door frame 134 a sufficient distance to permit the carrier door 140 to clear the door frame 134 when the chamber door 136 slides and/or otherwise moves downward into the chamber 132.

As shown in FIG. 4E, the chamber door 136 may slide and/or otherwise move out of the way of the opening in the door frame 134 such that the wafer transport tool 124 is permitted to access the transport carrier 112 through the opening in the door frame 134. In some implementations, the chamber door 136 slides and/or otherwise moves downward within the chamber 132. In some implementations, the chamber door 136 slides and/or otherwise moves upward within the chamber 132. In some implementations, the chamber door 136 slides and/or otherwise moves to a side within the chamber 132. In some implementations, the chamber door 136 slides and/or otherwise moves in a combination of directions within the chamber 132.

As shown in FIG. 4F, the wafer transport tool 124 of the interface tool 106 may retrieve and/or obtain a wafer 406 from the transport carrier 112 through the opening in the door frame 134 and through the opening 128. In this way, the wafer transport tool 124 retrieves and/or obtains the wafer 406 from the transport carrier 112 while the air-tight seal is formed around the transport carrier 112 by the sealing component 138. As shown in FIG. 4G, the wafer transport tool 124 may retract the wafer 406 through the opening in the door frame 134 and through the opening 128 into the chamber 118 of the interface tool 106. As shown in FIG. 4H, the wafer transport tool 124 may provide the wafer 406 to the semiconductor processing tool 102 through the opening 130. The wafer 406 may be processed by the semiconductor processing tool 102 through one or more semiconductor processing operations.

As shown in FIG. 4I, the wafer transport tool 124 may retrieve the wafer 406 from the semiconductor processing tool 102 through the opening 130 (e.g., after the semiconductor processing tool 102 processes the wafer 406 through one or more semiconductor processing operations) and retracts the wafer 406 into the chamber 118 of the interface tool 106. As shown in FIG. 4J, the wafer transport tool 124 may extend into the opening 128 and the opening in the chamber door 136 to place and/or otherwise provide the wafer 406 to the transport carrier 112.

As shown in FIG. 4K, the chamber door 136 (with the carrier door 140 mounted to the mounting plate 302) may move upward within the chamber 132. As shown in FIG. 4L, the chamber door 136 (with the carrier door 140 mounted to the mounting plate 302) may move toward the door frame 134 and may form an air-tight seal between the door frame 134 and the chamber door 136. The support structure 304 may extend toward the transport carrier 112 and may place the carrier door 140 onto the body 114 of the transport carrier 112. The vacuum hole(s) 306 may release the vacuum seal between the carrier door 140 and the mounting plate 302, and the latch key(s) 308 may latch the carrier door 140 onto the body 114 of the transport carrier 112.

As shown in FIG. 4M, the sealing components 138 may transition from the second position 250 (e.g., the contract configuration) to the first position 240 (e.g., the expanded configuration) to release the air-tight seal around the transport carrier 112. As shown in FIG. 4N, the shuttle platform 110 may slide and/or otherwise move the transport carrier 112 out of the chamber 132 and the opening 126. In some implementations, a mobile robot, an OHT, or another transport tool may transport the transport carrier 112 to another location in the example semiconductor processing environment 100.

As indicated above, FIGS. 4A-4N are provided as examples. Other examples may differ from what is described with regard to FIGS. 4A-4N.

Figure 5:
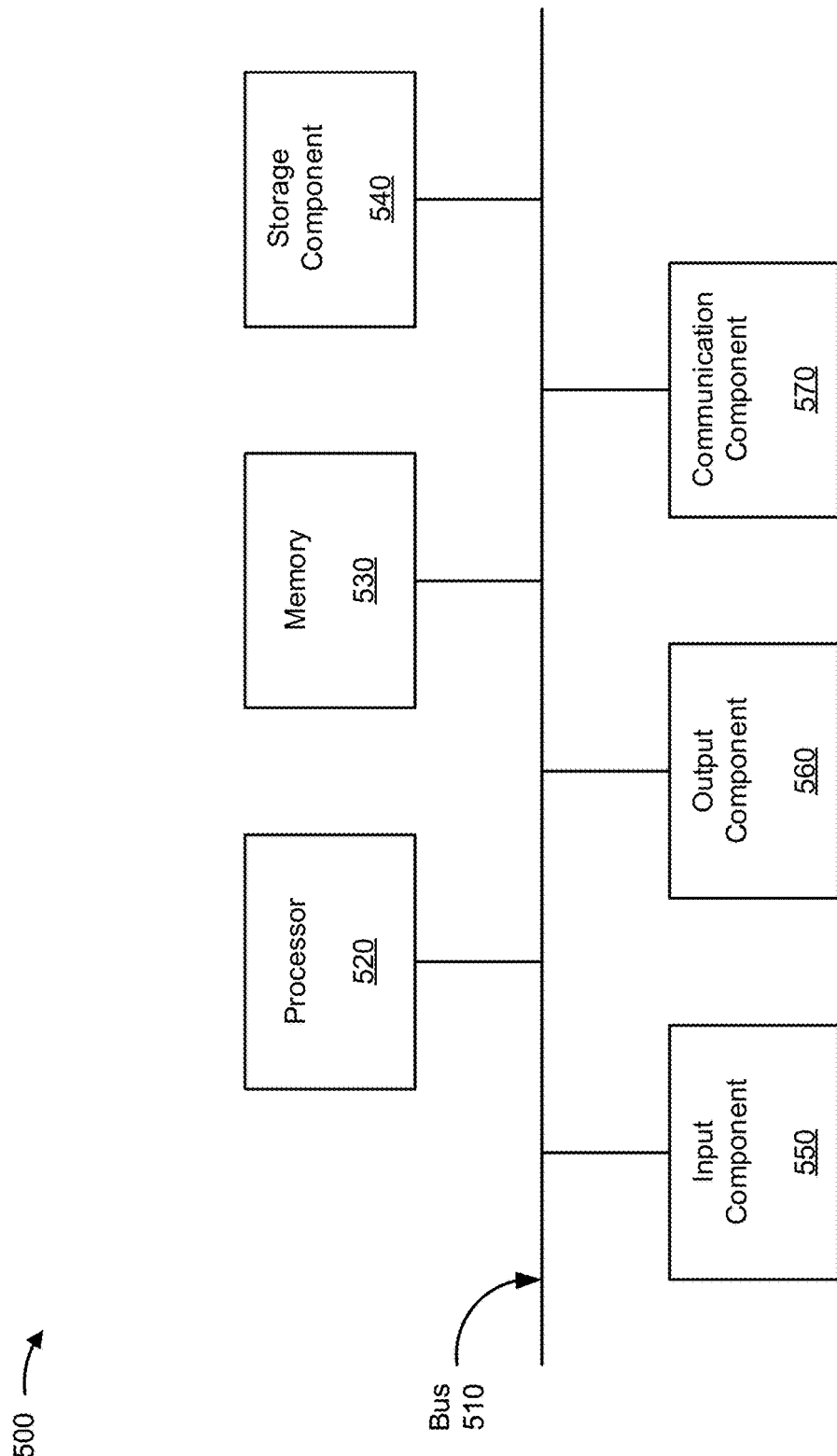
FIG. 5 is a diagram of example components of one or more devices of FIG. 2.

FIG. 5 is a diagram of example components of a device 500. In some implementations, one or more devices and/or tools of the example semiconductor processing environment 100 (e.g., the semiconductor processing tool 102, the load port 104, the interface tool 106, and/or the docking device 108) may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
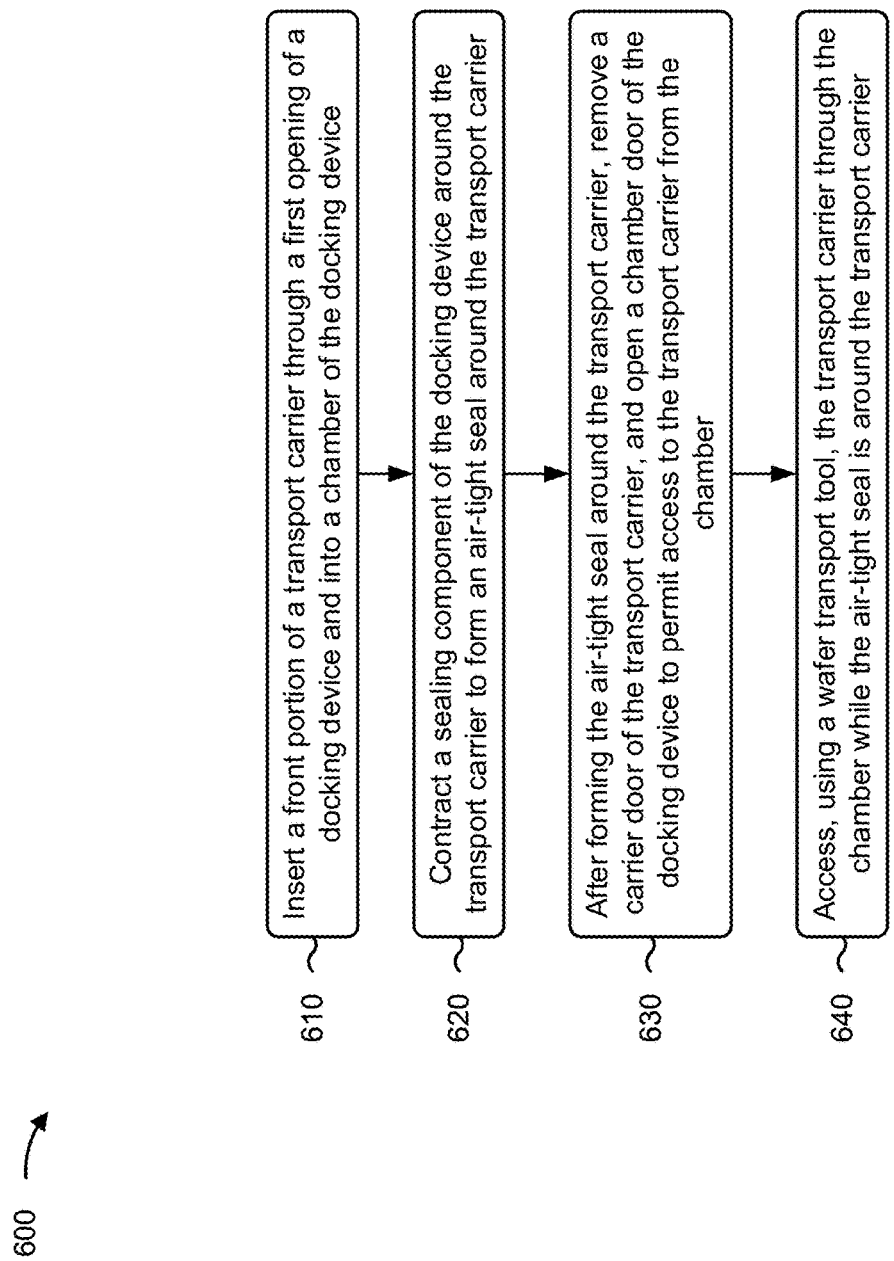

FIG. 6 is a flowchart of an example process 600 associated with accessing a transport carrier. In some implementations, one or more process blocks of FIG. 6 may be performed by a docking device (e.g., docking device 108). In some implementations, one or more process blocks of FIG. 6 may be performed by another device or a group of devices separate from or including the docking device, such as a semiconductor processing tool 102, a load port 104, an interface tool 106, a wafer transport tool 124, and/or another device. Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include inserting a front portion of a transport carrier through a first opening of a docking device and into a chamber of the docking device (block 610). For example, the load port 104 may insert a front portion of a transport carrier 112 through a first opening 126 of a docking device 108 and into a chamber 132 of the docking device, as described above.

As further shown in FIG. 6, process 600 may include contracting a sealing component of the docking device around the transport carrier to form an air-tight seal around the transport carrier (block 620). For example, the docking device 108 may contract a sealing component 138 of the docking device 108 around the transport carrier 112 to form an air-tight seal around the transport carrier 112, as described above.

As further shown in FIG. 6, process 600 may include, after forming the air-tight seal around the transport, carrier removing a carrier door of the transport carrier and opening a chamber door of the docking device to permit access to the transport carrier from the chamber (block 630). For example, the docking device 108 may, after forming the air-tight seal around the transport carrier 112, remove a carrier door 140 of the transport carrier 112 and open a chamber door 136 of the docking device 108 to permit access to the transport carrier 112 from the chamber 132, as described above.

As further shown in FIG. 6, process 600 may include accessing, using a wafer transport tool, the transport carrier through the chamber while the air-tight seal is around the transport carrier (block 640). For example, the interface tool 106 may access, using a wafer transport tool 124, the transport carrier 112 through the chamber 132 while the air-tight seal is around the transport carrier 112, as described above.

Process 600 may include additional implementations, such as any single implementation or any combination of implementations described below and/or in connection with one or more other processes described elsewhere herein.

In a first implementation, accessing the transport carrier 112 includes retrieving (e.g., using the wafer transport tool 124) a wafer 406 from the transport carrier 112 through the chamber 132 while the air-tight seal is around the transport carrier 112, and providing (e.g., using the wafer transport tool 124) the wafer 406 to a semiconductor processing tool 102. In a second implementation, alone or in combination with the first implementation, accessing (e.g., using the wafer transport tool 124) the transport carrier 112 includes retrieving a wafer 406 from a semiconductor processing tool 102, and providing (e.g., using the wafer transport tool 124) the wafer 406 to the transport carrier 112 through the chamber 132 while the air-tight seal is around the transport carrier 112.

In a third implementation, alone or in combination with one or more of the first and second implementations, inserting the front portion of the transport carrier 112 through the first opening 126 includes placing the transport carrier 112 on a shuttle platform 110, and sliding the shuttle platform 110 with the transport carrier 112 thereon through the first opening 126. In a fourth implementation, alone or in combination with one or more of the first through third implementations, removing the carrier door 140 includes pressing a mounting plate 302, attached to the chamber door 136, against the carrier door 140, forming a vacuum seal between the mounting plate 302 and the carrier door 140, and retracting the mounting plate 302 toward the chamber door 136 while the vacuum seal is between the mounting plate 302 and the carrier door 140.

In a fifth implementation, alone or in combination with one or more of the first through fourth implementations, the sealing component 138 includes two or more portions (e.g., the portion 138a, the portion 138b, the portion 138c, and/or the portion 138d), and contracting the sealing component 138 around the transport carrier 112 to form the air-tight seal around the transport carrier 112 includes moving the two or more portions from a first position (240) to a second position (250), in which the two or more portions are contracted around the transport carrier 112, to form the air-tight seal around the transport carrier 112. In a sixth implementation, alone or in combination with one or more of the first through fifth implementations, opening the chamber door 136 to permit access to the transport carrier 112 from the chamber 132 includes sliding the chamber door 136 away from a door frame 134 in the chamber 132, where sliding the chamber door 136 away from the door frame 134 releases another air-tight seal between the chamber door 136 and the door frame 134, and sliding the chamber door 136 downward in the chamber 132.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

FIG. 7 is a flowchart of an example process 700 associated with accessing a transport carrier. In some implementations, one or more process blocks of FIG. 7 may be performed by a docking device (e.g., docking device 108). In some implementations, one or more process blocks of FIG. 7 may be performed by another device or a group of devices separate from or including the docking device, such as a semiconductor processing tool 102, a load port 104, an interface tool 106, a wafer transport tool 124, and/or another device. Additionally, or alternatively, one or more process blocks of FIG. 7 may be performed by one or more components of device 500, such as processor 520, memory 530, storage component 540, input component 550, output component 560, and/or communication component 570.

As shown in FIG. 7, process 700 may include retrieving, using a wafer transport tool, a wafer from a semiconductor processing tool (block 710). For example, the wafer transport tool 124 may retrieve the wafer 406 from the semiconductor processing tool 102, as described above.

As further shown in FIG. 7, process 700 may include providing, using the wafer transport tool, the wafer to a transport carrier through a chamber of a docking device while an air-tight seal is around a front portion of the transport carrier that is inserted through an opening in the chamber (block 720). For example, the wafer transport tool 124 may provide the wafer 406 to the transport carrier 114 through the chamber 132 of the docking device 106 while an air-tight seal is around a front portion of the transport carrier 114 that is inserted through the opening 126 in the chamber 132, as described above.

As further shown in FIG. 7, process 700 may include placing a carrier door onto the transport carrier while the air-tight seal is around the front portion of the transport carrier (block 730). For example, the docking device 108 may place the carrier door 140 onto the transport carrier 114 while the air-tight seal is around the front portion of the transport carrier 114, as described above.

As further shown in FIG. 7, process 700 may include retracting a sealing component of the docking device around the transport carrier to remove the air-tight seal around the transport carrier after placing the carrier door onto the transport carrier (block 740). For example, the docking device 108 may retract the sealing component 138 of the docking device 108 around the transport carrier 114 to remove the air-tight seal around the transport carrier 114 after placing the carrier door 140 onto the transport carrier 114, as described above.

Process 700 may include additional implementations, such as any single implementation or any combination of implementations described below and/or in connection with one or more other processes described elsewhere herein.

In a first implementation, placing the carrier door 140 onto the transport carrier 114 includes placing the carrier door 140 onto the transport carrier 114 using the mounting plate 302 on the chamber door 136. In a second implementation, alone or in combination with the first implementation, the mounting plate 302 includes one or more vacuum holes 306 configured to form a vacuum seal between the carrier door 140 and the mounting plate 302, and the chamber door 136 further includes a support structure 304 configured to extend the mounting plate 302 toward the transport carrier 114 to place the carrier door 140 onto the transport carrier 114 while the vacuum seal is formed between the carrier door 140 and the mounting plate 302 to place the carrier door 140 onto the transport carrier 114.

In a third implementation, alone or in combination with one or more of the first and second implementations, placing the carrier door 140 onto the transport carrier 114 includes latching the carrier door 140 onto the transport carrier 114 using a latch key 308 on the mounting plate 302. In a fourth implementation, alone or in combination with one or more of the first through third implementations, process 700 includes forming another air-tight seal between the chamber door 136 and a door frame 134 in the chamber 132. In a fifth implementation, alone or in combination with one or more of the first through fourth implementations, forming the other air-tight seal between the chamber door 136 and the door frame 134 includes forming the other air-tight seal between the chamber door 136 and the door frame 134 prior to retracting the sealing component 138 to remove the air-tight seal around the transport carrier 114.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, a transport carrier docking device may be positioned between a load port and an interface tool to reduce and/or minimize cross contamination of semiconductor wafers that are transferred between the load port and an associated semiconductor processing tool. The transport carrier docking device may be capable of forming an air-tight seal around a transport carrier while a front portion of the transport carrier is inserted into a chamber of the transport carrier docking device. Semiconductor wafers in the transport carrier may be accessed by a transport tool while the air-tight seal around the transport carrier prevents and/or reduces the likelihood that contaminants in the semiconductor fabrication facility will reach the semiconductor wafers. The air-tight seal around the transport carrier may reduce defects of the semiconductor wafers that might otherwise be caused by the contaminants, may increase manufacturing yield and quality in the semiconductor fabrication facility, and/or may permit the continued reduction in device and/or feature sizes of integrated circuits and/or semiconductor devices that are to be formed on semiconductor wafers.

As described in greater detail above, some implementations described herein provide a docking device. The docking device includes a chamber. The docking device includes a first opening in a first side of the chamber. The docking device includes a second opening in a second side of the chamber. The docking device includes a chamber door configured to form a first air-tight seal against a door frame of a docking interface, where the chamber door is configured to form the first air-tight seal in the chamber between the first opening and the second opening when the chamber door is in a closed position. The docking device includes a sealing component configured to form a second air-tight seal around a transport carrier when the transport carrier is at least partially inserted into the first opening.

As described in greater detail above, some implementations described herein provide a method. The method includes inserting a front portion of a transport carrier through a first opening of a docking device and into a chamber of the docking device. The method includes contracting a sealing component of the docking device around the transport carrier to form an air-tight seal around the transport carrier. The method includes, after forming the air-tight seal around the transport carrier, removing a carrier door of the transport carrier and opening a chamber door of the docking device to permit access to the transport carrier from the chamber. The method includes accessing, using a wafer transport tool, the transport carrier through the chamber while the air-tight seal is around the transport carrier.

As described in greater detail above, some implementations described herein provide a method. The method includes retrieving, using a wafer transport tool, a wafer from a semiconductor processing tool. The method includes providing, using the wafer transport tool, the wafer to a transport carrier through a chamber of a docking device while an air-tight seal is around a front portion of the transport carrier that is inserted through an opening in the chamber. The method includes placing a carrier door onto the transport carrier while the air-tight seal is around the front portion of the transport carrier. The method includes retracting a sealing component of the docking device around the transport carrier to remove the air-tight seal around the transport carrier after placing the carrier door onto the transport carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A docking device, comprising:
   a chamber;
   a first opening in a first side of the chamber;
   a second opening in a second side of the chamber;
   a chamber door configured to form a first air-tight seal against a door frame of a docking interface,
      wherein the chamber door is configured to form the first air-tight seal in the chamber between the first opening and the second opening when the chamber door is in a closed position; and
   a sealing component configured to form a second air-tight seal around a transport carrier when the transport carrier is at least partially inserted into the first opening,
      wherein a portion of the sealing component is configured to transition at least one of upward or horizontally inward from a first position to a second position to form the second air-tight seal.

2. The docking device of claim 1,
   wherein the portion is a first portion;
   wherein the sealing component includes a second portion; and
   wherein the second portion is configured to transition from the first position to the second position to form the second air-tight seal.

3. The docking device of claim 1, wherein the chamber door comprises:
   a mounting plate configured to remove a carrier door of the transport carrier while the second air-tight seal is around the transport carrier, and
   a support structure to extend and retract the mounting plate.

4. The docking device of claim 1, wherein the sealing component includes three or more portions.

5. The docking device of claim 1, wherein the chamber door is configured to remove a carrier door from the transport carrier while the second air-tight seal is formed around the transport carrier by the sealing component.

6. The docking device of claim 5, wherein the chamber door is configured to move, after removing the carrier door from the transport carrier, to permit a wafer transport tool to access the transport carrier through the chamber.

7. The docking device of claim 6, wherein the chamber door is configured to move toward the second opening and downward in the chamber after removing the carrier door from the transport carrier.

8. A method, comprising:
   inserting a front portion of a transport carrier through a first opening of a docking device and into a chamber of the docking device;
   contracting a sealing component of the docking device around the transport carrier to form an air-tight seal around the transport carrier, wherein a portion of the sealing component is configured to transition at least one of upward or horizontally inward from a first position to a second position to form the air-tight seal;
   after forming the air-tight seal around the transport carrier:
      removing a carrier door of the transport carrier, and
      opening a chamber door of the docking device to permit access to the transport carrier from the chamber; and
   accessing, using a wafer transport tool, the transport carrier through the chamber while the air-tight seal is around the transport carrier.

9. The method of claim 8, wherein accessing the transport carrier comprises:
   retrieving a wafer from the transport carrier through the chamber while the air-tight seal is around the transport carrier; and
   providing the wafer to a semiconductor processing tool.

10. The method of claim 8, wherein accessing the transport carrier comprises:
  retrieving a wafer from a semiconductor processing tool; and
  providing the wafer to the transport carrier through the chamber while the air-tight seal is around the transport carrier.

11. The method of claim 8, wherein inserting the front portion of the transport carrier through the first opening comprises:
  placing the transport carrier on a shuttle platform; and
  sliding the shuttle platform with the transport carrier thereon through the first opening.

12. The method of claim 8, wherein removing the carrier door comprises:
  pressing a mounting plate, attached to the chamber door, against the carrier door;
  forming a vacuum seal between the mounting plate and the carrier door; and
  retracting the mounting plate toward the chamber door while the vacuum seal is between the mounting plate and the carrier door.

13. The method of claim 8, wherein the sealing component includes two or more portions; and
  wherein contracting the sealing component around the transport carrier to form the air-tight seal around the transport carrier comprises:
  moving the two or more portions from the first position to the second position to form the air-tight seal around the transport carrier.

14. The method of claim 8, wherein opening the chamber door to permit access to the transport carrier from the chamber comprises:
  sliding the chamber door away from a door frame in the chamber,
    wherein sliding the chamber door away from the door frame releases another air-tight seal between the chamber door and the door frame; and
  sliding the chamber door downward in the chamber.

15. A method, comprising:
  retrieving, using a wafer transport tool, a wafer from a semiconductor processing tool;
  providing, using the wafer transport tool, the wafer to a transport carrier through a chamber of a docking device while an air-tight seal, formed by a sealing component of the docking device, is around a front portion of the transport carrier that is inserted through an opening in the chamber,
    wherein a portion of the sealing component is configured to transition at least one of upward or horizontally inward from a first position to a second position to form the air-tight seal;
  placing a carrier door onto the transport carrier while the air-tight seal is around the front portion of the transport carrier; and
  retracting the sealing component around the transport carrier to remove the air-tight seal around the transport carrier after placing the carrier door onto the transport carrier.

16. The method of claim 15, wherein placing the carrier door onto the transport carrier comprises:
  placing the carrier door onto the transport carrier using a mounting plate on a chamber door.

17. The method of claim 16, wherein the mounting plate comprises:
  one or more vacuum holes configured to form a vacuum seal between the carrier door and the mounting plate; and
  wherein the chamber door further comprises:
    a support structure configured to extend the mounting plate toward the transport carrier to place the carrier door onto the transport carrier while the vacuum seal is formed between the carrier door and the mounting plate to place the carrier door onto the transport carrier.

18. The method of claim 16, wherein placing the carrier door onto the transport carrier comprises:
  latching the carrier door onto the transport carrier using a latch key on the mounting plate.

19. The method of claim 16, further comprising:
  forming another air-tight seal between the chamber door and a door frame in the chamber.

20. The method of claim 19, wherein forming the other air-tight seal between the chamber door and the door frame comprises:
  forming the other air-tight seal between the chamber door and the door frame prior to retracting the sealing component to remove the air-tight seal around the transport carrier.

* * * * *